(12) United States Patent
Hu et al.

(10) Patent No.: US 11,694,982 B2
(45) Date of Patent: Jul. 4, 2023

(54) SIDEWALL WETTING BARRIER FOR CONDUCTIVE PILLARS

(71) Applicant: QUALCOMM Incorporated, San Diego, CA (US)

(72) Inventors: Wei Hu, San Diego, CA (US); Dongming He, San Diego, CA (US); Wen Yin, Chandler, AZ (US); Zhe Guan, Chandler, AZ (US); Lily Zhao, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/185,244

(22) Filed: Feb. 25, 2021

(65) Prior Publication Data

US 2022/0270995 A1  Aug. 25, 2022

(51) Int. Cl.
*H01L 23/00* (2006.01)

(52) U.S. Cl.
CPC .............. *H01L 24/13* (2013.01); *H01L 24/05* (2013.01); *H01L 24/11* (2013.01); *H01L 2224/11013* (2013.01); *H01L 2224/11622* (2013.01); *H01L 2224/11849* (2013.01); *H01L 2224/13147* (2013.01); *H01L 2224/13584* (2013.01); *H01L 2224/13655* (2013.01)

(58) Field of Classification Search
CPC ......... H01L 24/13; H01L 24/05; H01L 24/11; H01L 2224/11013; H01L 2224/11622; H01L 2224/11849; H01L 2224/13147; H01L 2224/13584; H01L 2224/13655
See application file for complete search history.

(56) References Cited

U.S. PATENT DOCUMENTS

| | | | |
|---|---|---|---|
| 8,803,337 B1* | 8/2014 | Lin | H01L 24/16 257/781 |
| 2012/0068334 A1* | 3/2012 | Migita | H01L 24/11 257/737 |
| 2012/0306073 A1 | 12/2012 | Yu et al. | |
| 2014/0077359 A1* | 3/2014 | Tsai | H01L 21/76885 257/737 |
| 2015/0340332 A1 | 11/2015 | Rinne et al. | |
| 2016/0322322 A1* | 11/2016 | Utsunomiya | H01L 24/11 |
| 2018/0294239 A1* | 10/2018 | Sakata | H01L 24/16 |
| 2021/0175193 A1* | 6/2021 | Yamamoto | H01L 24/13 |
| 2021/0272921 A1* | 9/2021 | Arifeen | H01L 24/05 |

OTHER PUBLICATIONS

Partial International Search Report—PCT/US2022/013697—ISA/EPO—dated Sep. 13, 2022.
International Search Report and Written Opinion—PCT/US2022/013697—ISA/EPO—dated Nov. 8, 2022.

\* cited by examiner

*Primary Examiner* — Douglas W Owens
(74) *Attorney, Agent, or Firm* — Muncy, Geissler, Olds & Lowe, P.C.

(57) ABSTRACT

Disclosed are examples of integrated circuit (IC) structures and techniques to fabricate IC structures. Each IC package may include a die (e.g., a flip-chip (FC) die) and one or more die interconnects to electrically couple the die to a substrate. The die interconnect may include a pillar, a wetting barrier on the pillar, and a solder cap on the wetting barrier. The wetting barrier may be wider than the pillar. The die interconnect may also include a low wetting layer formed on the wetting barrier.

30 Claims, 24 Drawing Sheets

SIDEWALL WETTING BARRIER FOR CONDUCTIVE PILLARS

FIELD OF DISCLOSURE

This disclosure relates generally to integrated circuits (IC) packages and structures, and more specifically, but not exclusively, to sidewall wetting barrier for conductive pillars, e.g., such as copper (Cu) pillar bumps.

BACKGROUND

Integrated circuit technology has achieved great strides in advancing computing power through miniaturization of active components. The package devices can be found in many electronic devices, including processors, servers, radio frequency (RF) integrated circuits, etc. Packaging technology becomes cost-effective in high pin count devices and/or high production volume components.

An example conventional IC structure of an IC package includes an IC structure and a substrate. The IC structure includes a die and one or more die interconnects to electrically couple the die with the substrate. Each die interconnect includes a solder cap on a copper (Cu) pillar. A solder reflow is performed to electrically connect the solder cap to a conductive pad of the substrate.

When the solder reflow is performed, it can be that a sidewall of the Cu pillar may get wet with solder. This can lead to problems such as unwanted electrical shorts due to solder bridging. It can also lead to low solder gap resulting in intermetallic compound (IMC) bridging and physical stress on the IC package.

Accordingly, there is a need for systems, apparatus, and methods that overcome the deficiencies of conventional IC packages and structures including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary integrated circuit (IC) structure is disclosed. The IC structure may comprise a die. The IC structure may also comprise a pillar on the die. A first surface of the pillar may face the die. The IC structure may further comprise a wetting barrier on a second surface of the pillar. A width of the wetting barrier may be greater than a width of the pillar. The IC structure may yet comprise a solder cap on the wetting barrier such that the die is electrically coupled to the solder cap at least through the pillar and the wetting barrier.

An exemplary method of fabricating an integrated circuit (IC) structure is disclosed. The method may comprise forming a pillar on a die. A first surface of the pillar may face the die. The method may also comprise forming a wetting barrier on a second surface of the pillar. A width of the wetting barrier may be greater than a width of the pillar. The method may further comprise forming a solder cap on the wetting barrier such that the die is electrically coupled to the solder cap at least through the pillar and the wetting barrier.

An exemplary integrated circuit (IC) package is disclosed. The IC package may comprise a substrate comprising a conductive pad. The IC package may also comprise an IC structure disposed on the substrate. The IC structure may comprise a die. The IC structure may also comprise a pillar on the die. A first surface of the pillar may face the die. The IC structure may further comprise a wetting barrier on a second surface of the pillar. A width of the wetting barrier may be greater than a width of the pillar. The IC structure may yet comprise a solder cap on the wetting barrier such that the die is electrically coupled to the conductive pad of the substrate at least through the solder cap, the pillar, and the wetting barrier.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
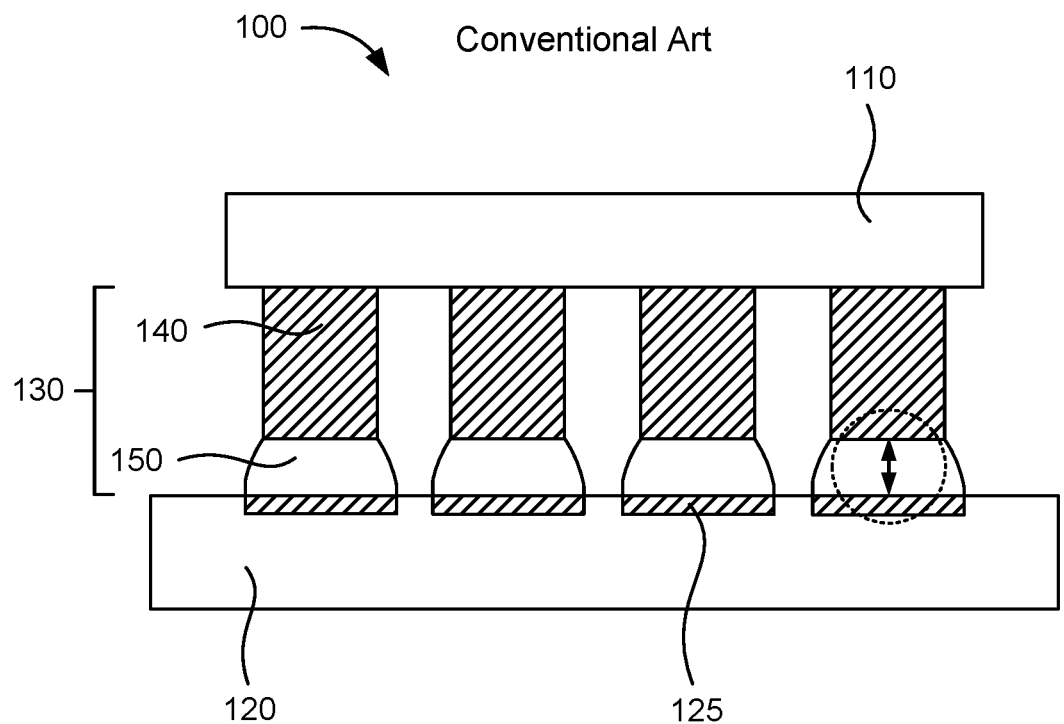
FIG. 1 illustrates an example of an ideal integrated circuit (IC) package with corresponding IC structure.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Figure 2:
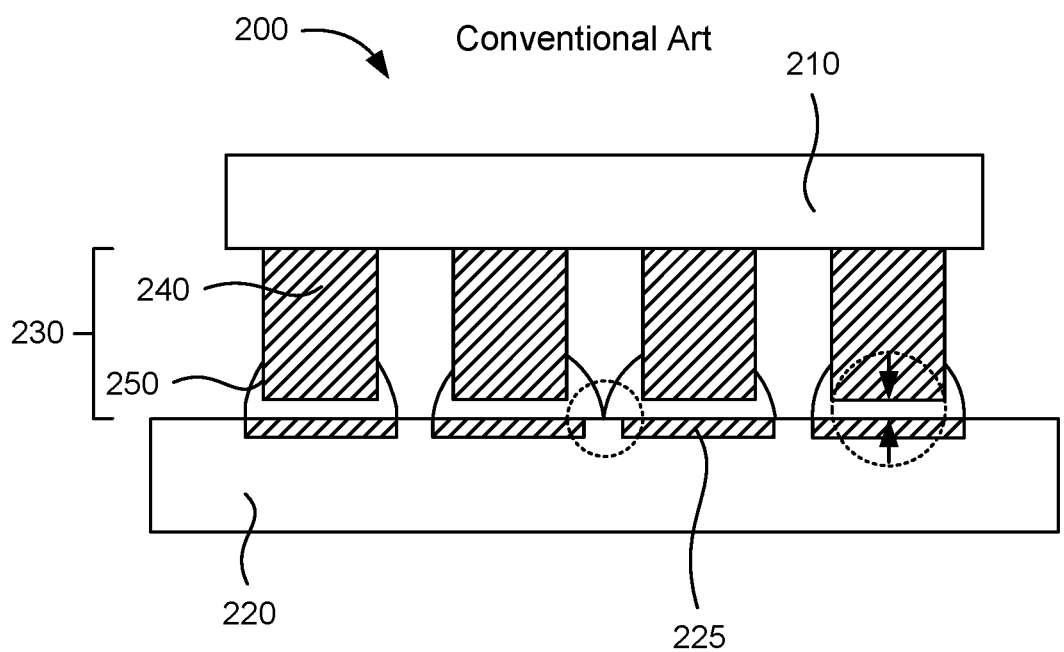
FIG. 2 illustrates a conventional IC package with IC structure with problematic sidewall wetting.

In accordance with various aspects herein, it is proposed to address issues associated with conventional IC packages and structures. For context, an example of an idealized IC package is illustrated in FIG. 1 and a conventional IC package with associated issues is illustrated in FIG. 2.

The ideal IC package 100 includes a die 110 and a substrate 120 with pads 125 which are conductive. One or more die interconnects 130 electrically couple the die 110 to the substrate 120, and in particular with the pads 125. Each die interconnect 130 includes a pillar 140 which is conductive (e.g., copper) and a solder cap 150 connected to the pads 125. In the context, the ideal IC package 100 may be said to include the substrate 120 and the idealized IC structure. That is, the idealized IC structure may be said to include the die 110 and the die interconnect 130.

The conventional IC package 200 includes a die 210 and a substrate 220 with pads 225 which are conductive. One or more die interconnects 230 electrically couple the die 210 to the substrate 220, and in particular with the pads 225. Each die interconnect 230 includes a pillar 240 (e.g., copper pillar) and a solder cap 250 connected to the pads 225. In the context, the conventional IC package may be said to include the substrate 220 and the conventional IC structure. That is, the conventional IC structure may be said to include the die 210 and the die interconnect 230.

In the ideal IC package 100, there is no sidewall wetting. That is, there is no solder formed on sidewalls of the copper pillars 140. Note that in FIG. 1, sidewalls of the pillars 140 are free of solder material. However, there is sidewall wetting on the copper pillars 240 of the conventional IC package 200. Sidewall wetting typically occurs during solder reflow. As sidewall wetting occurs, solder material gets pushed to the side. As seen in FIG. 2, sidewalls of the pillars 240 are wet with solder material.

In the ideal IC package 100 without sidewall wetting, there is a good solder gap height. In this context, solder gap height is defined as the distance between lower and upper surfaces of the solder cap 150 as highlighted in the dashed circle in FIG. 1. Good solder gap height may also be viewed as a solder gap height that is sufficient to prevent intermetallic compound (IMC) bridging. Good solder gap height can also prevent physical stresses which minimizes mechanical failures.

However, in the conventional IC package 200 with sidewall wetting, the solder gap height is significantly smaller as highlighted in the bigger dashed circle of FIG. 2. During solder reflow, as solder material of the solder cap 250 gets pushed to the side, there is less solder material in between the pillar 240 and the substrate 220, which leads to shortening of the solder gap height. Small solder gap height can lead IMC bridging and increase the likelihood of mechanical failures.

Further, in the ideal IC package 100 without sidewall wetting, there is no solder bridging that can cause unwanted electrical shorts from occurring since the solder material remains underneath the pillar 140. But in the conventional IC package 200 with solder wetting, solder bridging—two solder caps 250 coming into contact with each other—can occur as highlighted in the smaller dashed circle of FIG. 2. Solder bridging becomes more likely as the pitch between adjacent die interconnects 230 becomes narrower and narrower.

Figure 3:
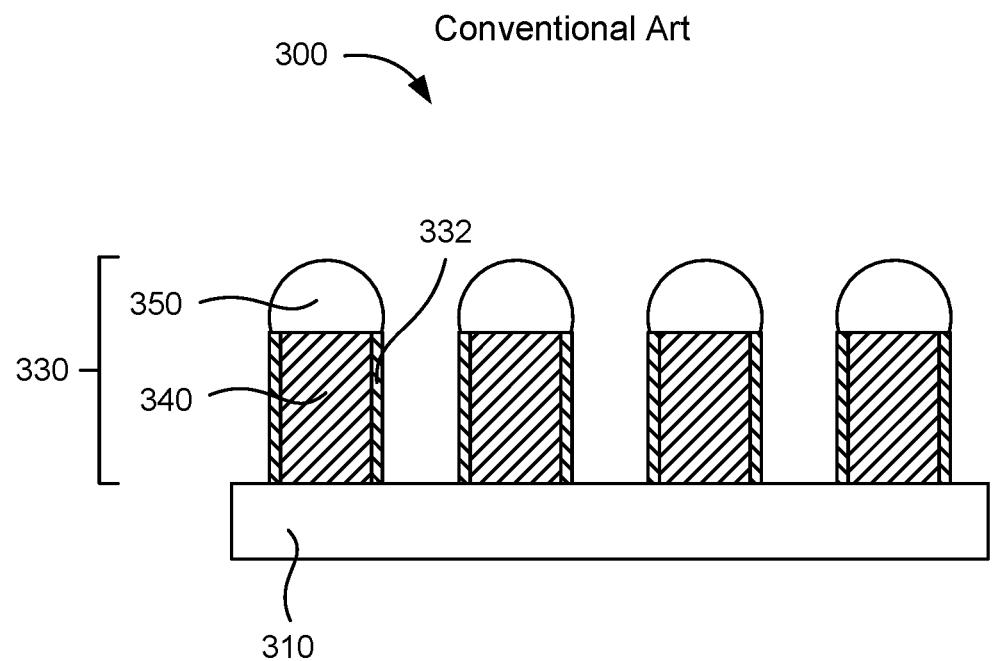
FIG. 3 illustrates a conventional IC structure to mitigate sidewall wetting issues.

There does exist some ways to mitigate solder wetting problems. FIG. 3 illustrates a conventional IC structure 300 to mitigate sidewall wetting issues. The IC structure 300 comprises a die 310 and a number of die interconnect 330. Each die interconnect 330 includes a copper pillar 340 and a solder cap 350. Each die interconnect 330 also includes a sidewall passivation 332.

During fabrication of the IC structure 300, the whole of the die interconnect 330 is covered with a passivation layer. That is, the sidewalls of the pillar 340 as well as the corresponding solder cap 350 are passivated. Then the solder cap 350 undergoes passivation cleaning (e.g., plasma etch) leaving behind the sidewall passivation 332 to minimize or prevent sidewall wetting.

Unfortunately, passivation cleaning is not always effective. In other words, even after cleaning, some of the passivation layer may still remain on the solder cap 350, which is undesirable. Also, solder sidewall wetting can still occur.

In accordance with the various aspects disclosed herein, to address issues associated with conventional IC packages and structures, it is proposed to provide a wetting barrier that serves to prevent solder sidewall wetting from occurring. The proposed wetting barrier can prevent sidewall from occurring in at least the following ways. First, the wetting barrier can be shaped so as to prevent sidewall wetting physically. Second, the wetting barrier can be formed from materials so as to prevent sidewall wetting chemically.

Figure 4:
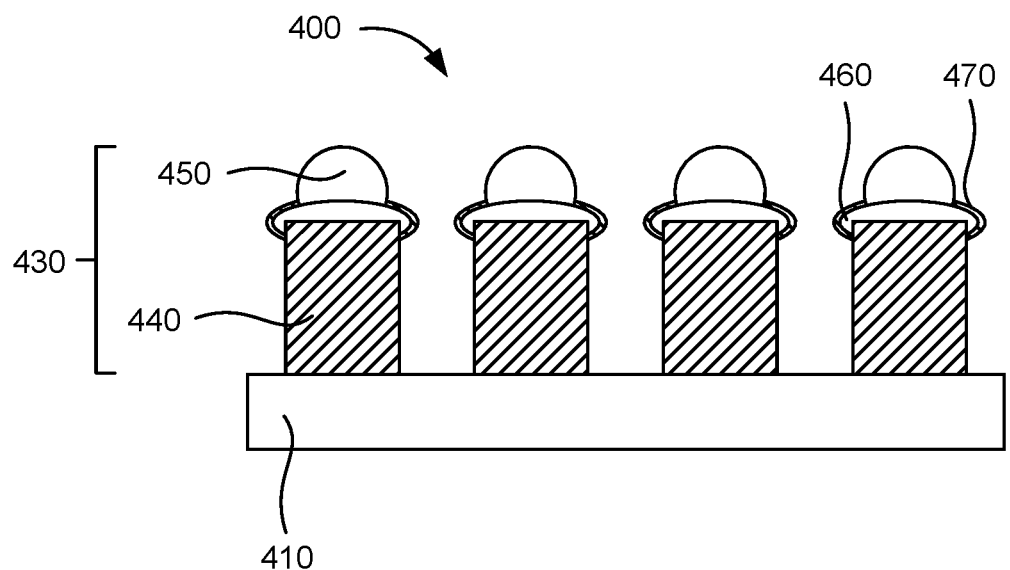
FIG. 4 illustrates an example IC structure to mitigate sidewall wetting issues in accordance with one or more aspects of the disclosure.

FIG. 4 illustrates an example IC structure 400 to mitigate sidewall wetting issues in accordance with one or more aspects of the disclosure. As seen, the IC structure 400 may include a die 410. For example, the die 410 may be a flip-chip (FC) die. The IC structure 400 may also include one or more die interconnects 430 on one side of the die 410. The die interconnects 430 may be electrically conductive to enable coupling of the die 410 with other components. Thus, the die interconnects 430 may be connected to an active side of the die 410. In an aspect, each die interconnect 430 may be assumed to be similar to other die interconnects 430. Therefore, a description of one die interconnect 430 will be provided.

A die interconnect 430 may include a pillar 440 formed on the die 410. The pillar 440 may be formed from conductive materials such as copper (Cu). A first surface (e.g., bottom surface) of the pillar 440 may face the die 410. For example, the first surface of the pillar 440 may be in contact with a side (e.g., active side) of the die 410.

The die interconnect 430 may also include a wetting barrier 460 on a second surface of the pillar 440. For example, the wetting barrier 460 may be in contact with the second surface of the pillar 440. The wetting barrier 460 may be formed from conductive materials. In one aspect, the wetting barrier 460 may be formed from same material as the pillar 440 (e.g., Cu). In another aspect, the wetting barrier 460 may be formed from different material (e.g., nickel (Ni), aluminum (Al), chromium (Cr), etc.).

The die interconnect 430 may further include a solder cap 450 on the wetting barrier 460. As seen, the solder cap 450 may be in contact with the wetting barrier 460. However, this is not strictly necessary. There may be other intervening elements or components between the solder cap 450 and the wetting barrier 460. Indeed, the pillar 440 is not required to be in contact with the die 410, and the wetting barrier 460 is not required to be in contact with the pillar 440. Whether or not there are intervening elements, it is sufficient that an electrical path be formed such that the die 410 is electrically coupled to the solder cap 450 at least through the pillar 440 and the wetting barrier 460.

In FIG. 4, the wetting barrier 460 is illustrated as being collar shaped (e.g., 3-5 μm overhang) under the solder cap 450. That is, the wetting barrier 460 may be wider than the pillar 440. The wetting barrier 460 may be also be wider than the solder cap 450. The shape of the wetting barrier 460 serves as a physical barrier to solder sidewall wetting of the pillar 440, e.g., during solder reflow. As such, passivation layer is not needed during fabrication. It will be appreciated that in at least some aspects, technical advantages disclosed include that no passivation cleaning is necessary, and the solder cap 450 may remain free of passivation layer.

Another technical advantage of the proposed IC structure is that it is fully compatible with existing bumping processes. In other words, little to no retooling would be required. Independent control of solder cap and pillar size using a two-step photo patterning can enable smaller solder caps with large under bump metallization (UBM) for fine pitch applications.

It is mentioned above that the wetting barrier 460 may be formed from same or different material from the pillar 440. When the wetting barrier 460 is formed from a different material, the material can be selected so as to also provide a chemical barrier to solder sidewall wetting. In general, the wetting barrier 460 should preferably have "worse" solderability than the pillar 440. That is, it should be more difficult form a solder joint with the wetting barrier 460 than with the pillar 440.

More formally, solderability of a material may be defined as a measure of the ease with which a soldered joint can be made to the material. Under this definition, a soldered joint can be formed more easily to a material with "high" solderability than to a material with a "low" solderability. Then, when the wetting barrier 460 and the pillar 440 are formed from different materials, it may be preferred that the solderability of the wetting barrier 460 be lower than the solderability of the pillar 440. For example, if the pillar 440 is formed from Cu, then the wetting barrier 460 may be formed from metals such as Ni, Al, Cr, etc.

The die interconnect 430 may additionally include an optional low wetting layer 470, which may be formed on at least a portion of a surface of the wetting barrier 460 not covered by the pillar 440. In FIG. 4, the low wetting layer 470 (e.g., 1-3 μm thick) is shown to be formed on the overhang portion of the wetting barrier 460. The low wetting layer 470 may also provide physical barrier protection. But more significantly, when the low wetting layer 470 (e.g., Ni, Al, Cr, etc.) is formed from material with lower solderability than the pillar 440 (e.g., Cu), chemical barrier protection may be provided.

The IC structure 400 of FIG. 4 is but one of numerous embodiments of the proposed IC structure. FIGS. 5A-5G, 6A-6G, 7A-7G, and 8A-8G illustrate examples of stages of fabricating embodiments of other IC structures. Again, in these figures, multiple die interconnects are shown. However, for simplicity of description, one die interconnect will be described in recognition that other die interconnects can be similarly fabricated.

Figure 5A:
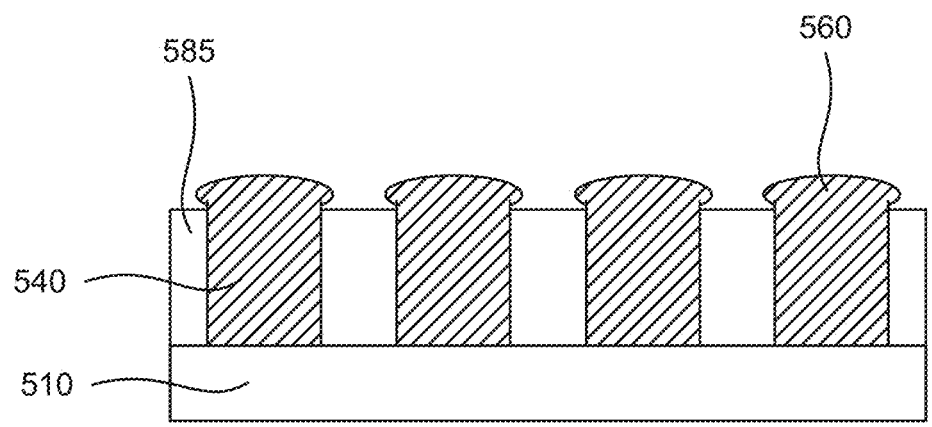
FIGS. 5A-5G illustrate examples of stages of fabricating an IC structure in accordance with one or more aspects of the disclosure.

FIGS. 5A-5G illustrate stages of fabricating an IC structure 500. FIG. 5A illustrates a stage in which a pillar 540 and a wetting barrier 560 may be formed on a die 510 (e.g., FC die). The pillar 540 may be formed from conductive materials (e.g., Cu) on the die 510. A first surface (e.g., bottom surface) of the pillar 540 may face the die 510. For example, the first surface of the pillar 540 may be in contact with a side (e.g., active side) of the die 510. Also, a wetting barrier 560 may be formed on the pillar 540.

The process to arrive at the FIG. 5A stage may be as follows. Initially a first photoresist 585 may be deposited on the die 510. The first photoresist 585 may be patterned with a first opening corresponding to a contact (not shown) of the die 510. This may be followed by forming the pillar 540 within the first opening and up to a height of the first photoresist 585 such that the second surface of the pillar 540 is exposed at a top surface of the first photoresist 585. For example, the pillar 540 may be formed from electroplating a metal (e.g., Cu) up to the top surface of the first photoresist 585.

Thereafter, the wetting barrier 560 may be formed on the exposed second surface of the pillar 540. If the pillar 540 and the wetting barrier 560 are formed from a same material (e.g., Cu), then the wetting barrier 560 may be formed by continuing the electroplating with same conductive material on the pillar 540 above the height of the first photoresist 585. Note that the wetting barrier 560 may be formed while the first photoresist 585 is still in place. Since there is no mask confinement above the first photoresist 585, the continued electroplating can result in a slight over-growth on top side above the first photoresist 585 to form the overhang. As a result, the wetting barrier 560 can be wider than the pillar 540.

Figure 5B:
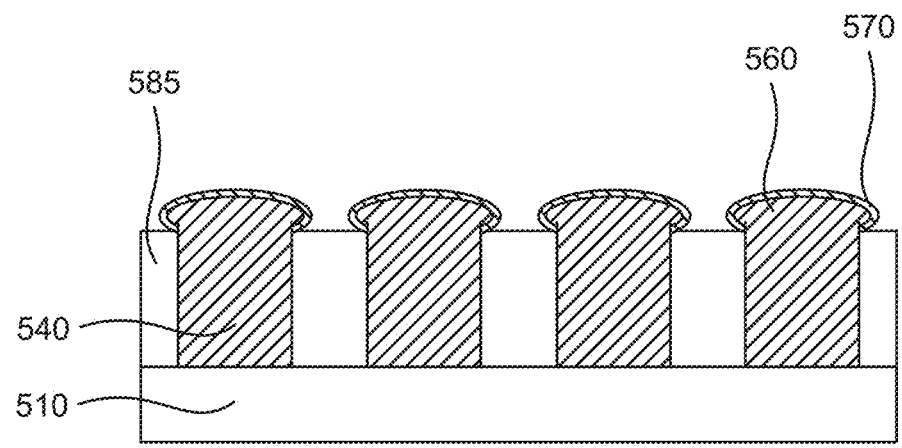

FIG. 5B illustrates a stage in which a low wetting layer 570 may be formed on exposed surface of the wetting barrier 560. Preferably, the low wetting layer 570 has a lower solderability than the pillar 540, i.e., it is more difficult for solder to adhere to the low wetting layer 570 than the pillar 540. For example, if the pillar 540 is formed from Cu, then the low wetting layer 570 may be formed by electroplating Ni, Al, Cr, etc. Note that if Ni is used, this is fairly standard in Cu bumping processes. The low wetting layer 570 may also be formed with the first photoresist 585 is still in place.

Figure 5C:
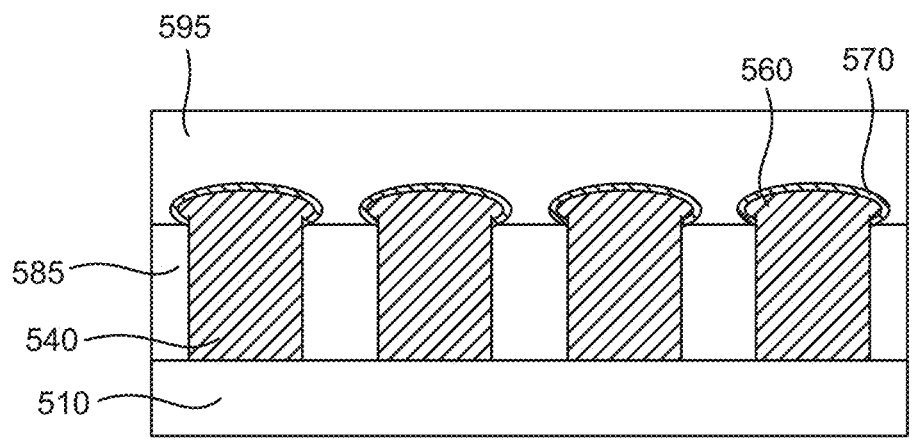

FIG. 5C illustrates a stage in which a second photoresist 595 may be deposited on the first photoresist 585 to cover the low wetting layer 570.

Figure 5D:
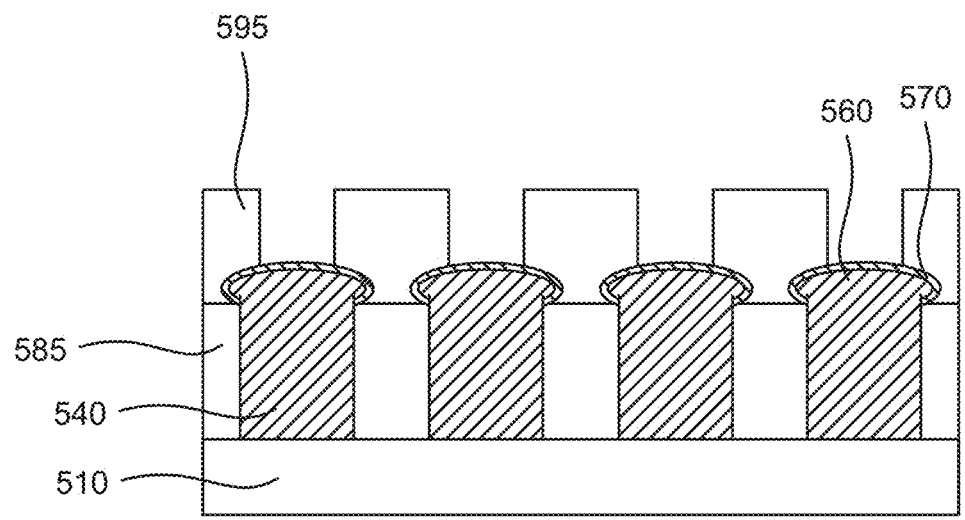

FIG. 5D illustrates a stage in which the second photoresist 595 may be patterned to form a second opening to expose a portion of the surface of the low wetting layer 570. A width of the second opening formed in the second photoresist 595 can be less than a width of the first opening formed in the first photoresist 585. The smaller width of the second opening allows accommodation of alignment offsets.

Figure 5E:
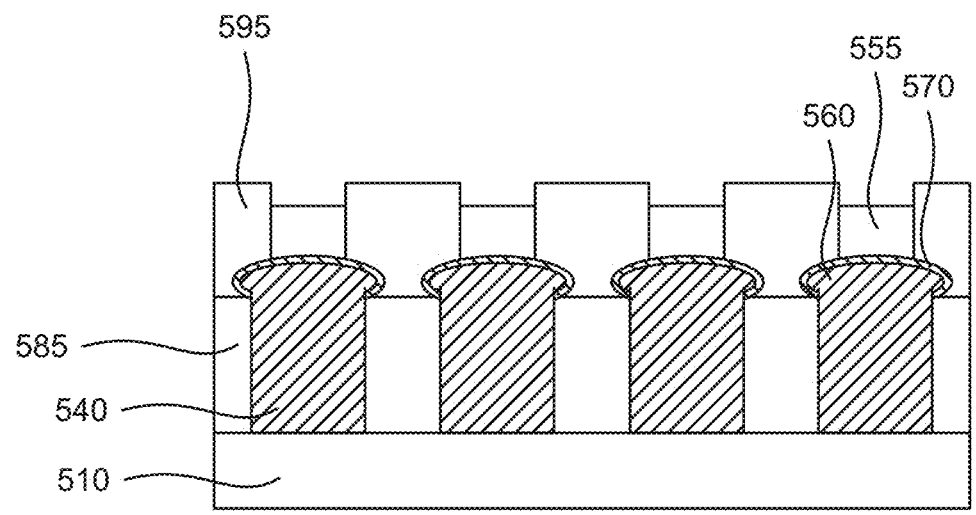

FIG. 5E illustrates a stage in which a solder material 555 may be deposited on the exposed portion of the low wetting layer 570 within the second opening. For example, the solder material 555 may be electroplated on the low wetting layer 570. Thereafter, the first and second photoresists 585, 595 may be removed.

Figure 5F:
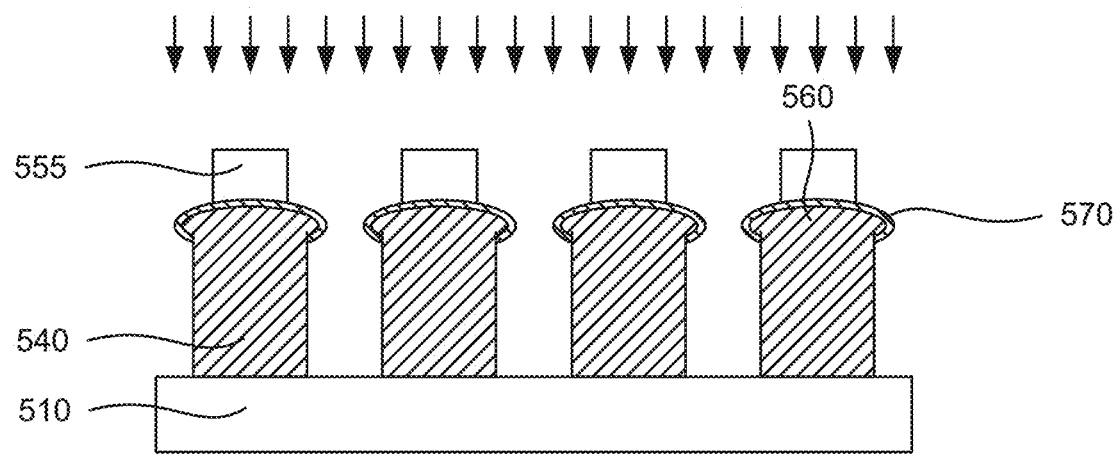

FIG. 5F illustrates a stage after the removal of the first and second photoresists 585, 595. In this stage, the exposed low wetting layer 570 may undergo a plasma treatment. For example, if the low wetting layer 570 is formed from nickel, then the N2+O2 plasma treatment may be performed to further lower the solderability of the low wetting layer 570 through oxidation.

Figure 5G:
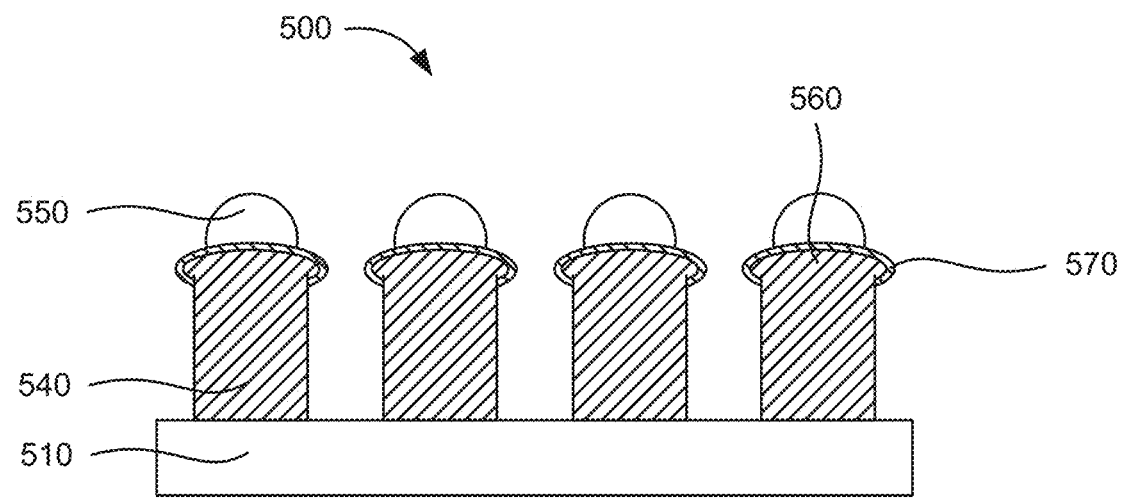

FIG. 5G illustrates a stage in which a seed layer etch and solder reflow may be performed, upon removal of the first and second photoresists 585, 595, to form the solder cap 550.

In an aspect, the stage of FIG. 5B may be optional. That is, the low wetting layer 570 need not be formed. Then the process may skip stage of FIG. 5A, i.e., may proceed from stage of FIG. 5A to stage of FIG. 5C. The stage of FIG. 5F may also be optional. That is, it may not be necessary to perform the plasma treatment to oxidize the low wetting layer 570. Then the process may skip stage of FIG. 5F, i.e., may proceed from stage of FIG. 5E to stage of FIG. 5G. Of course, if the low wetting layer 570 is not formed (i.e., stage of FIG. 5B is skipped), then stage of FIG. 5F may also be skipped.

Figure 6A:
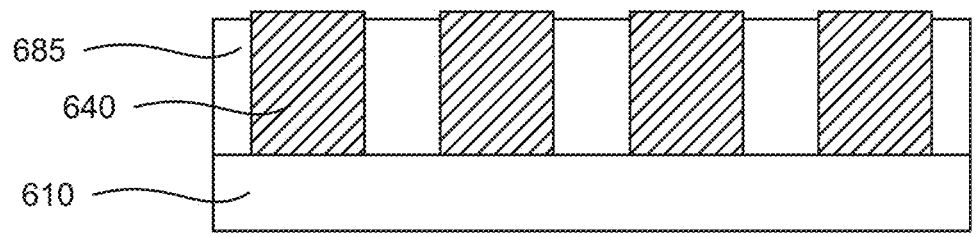
FIGS. 6A-6G illustrate examples of stages of fabricating another IC structure in accordance with one or more aspects of the disclosure.

FIGS. 6A-6G illustrate stages of fabricating an IC structure 600. FIG. 6A illustrates a stage in which a pillar 640 may be formed on a die 610 (e.g., FC die). The pillar 640 may be formed from conductive materials (e.g., Cu) on the die 610. A first surface of the pillar 640 may face the die 610. For example, the first surface of the pillar 640 may be in contact with a side (e.g., active side) of the die 610.

The process to arrive at the FIG. 6A stage may be as follows. Initially a first photoresist 685 may be deposited on the die 610. The first photoresist 685 may be patterned with a first opening corresponding to a contact (not shown) of the die 610. This may be followed by forming the pillar 640 within the first opening and up to a height of the first photoresist 685 such that the second surface of the pillar 640 is exposed at a top surface of the first photoresist 685. For example, the pillar 640 may be formed from electroplating a metal (e.g., Cu) up to the top surface of the first photoresist 685.

Figure 6B:
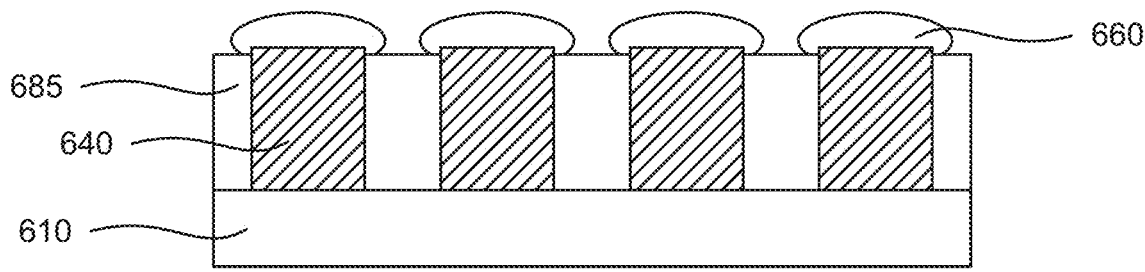

FIG. 6B illustrates a stage in which a wetting barrier 660 may be formed on the pillar 640. If the pillar 640 (e.g., Cu) and the wetting barrier 660 (e.g., Ni) are formed from different materials, then the wetting barrier 660 may be formed by electroplating the different material on the pillar 640 above the height of the first photoresist 685. Note that the wetting barrier 660 may be formed while the first photoresist 685 is still in place. Since there is no mask confinement above the first photoresist 685, the electroplating can result in the wetting barrier 660 being mushroom or collar shaped with overhang over the pillar 640. As a result, the wetting barrier 660 can be wider than the pillar 640.

Figure 6C:
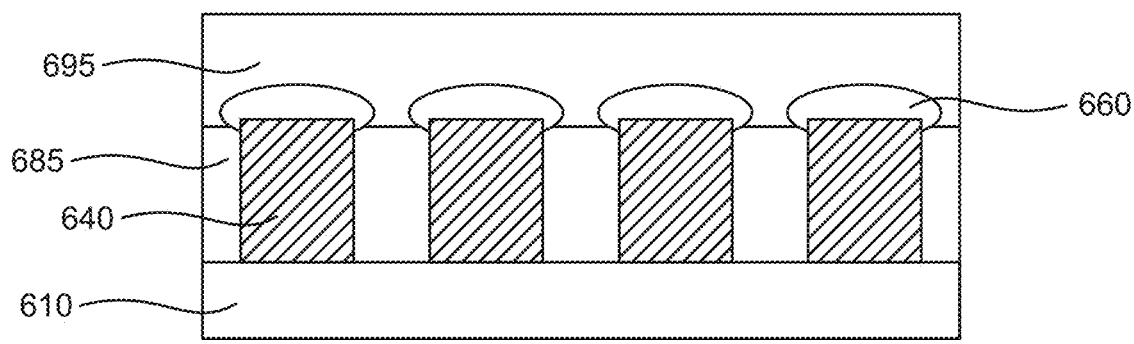

FIG. 6C illustrates a stage in which a second photoresist 695 may be deposited on the first photoresist 685 to cover the wetting barrier 660.

Figure 6D:
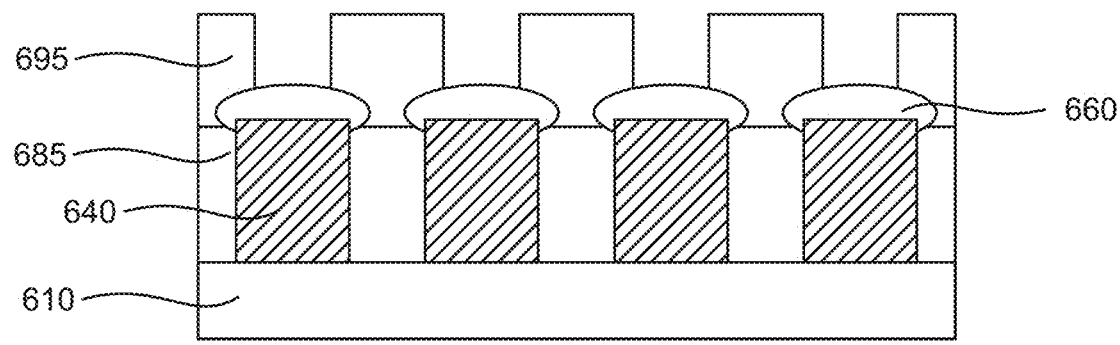

FIG. 6D illustrates a stage in which the second photoresist 695 may be patterned to form a second opening to expose a portion of the surface of the wetting barrier 660. A width of the second opening formed in the second photoresist 695 can be less than a width of the first opening formed in the first photoresist 685, e.g., to accommodate alignment offsets.

Figure 6E:
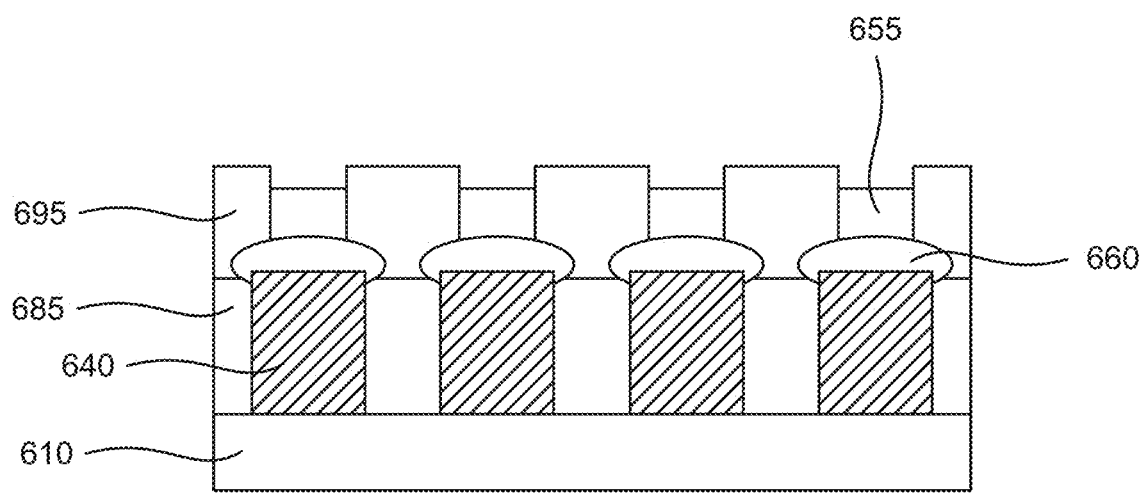

FIG. 6E illustrates a stage in which a solder material 655 may be deposited on the exposed portion of the wetting barrier 660 within the second opening. For example, the solder material 655 may be electroplated on the wetting barrier 660. Thereafter, the first and second photoresists 685, 695 may be removed.

Figure 6F:
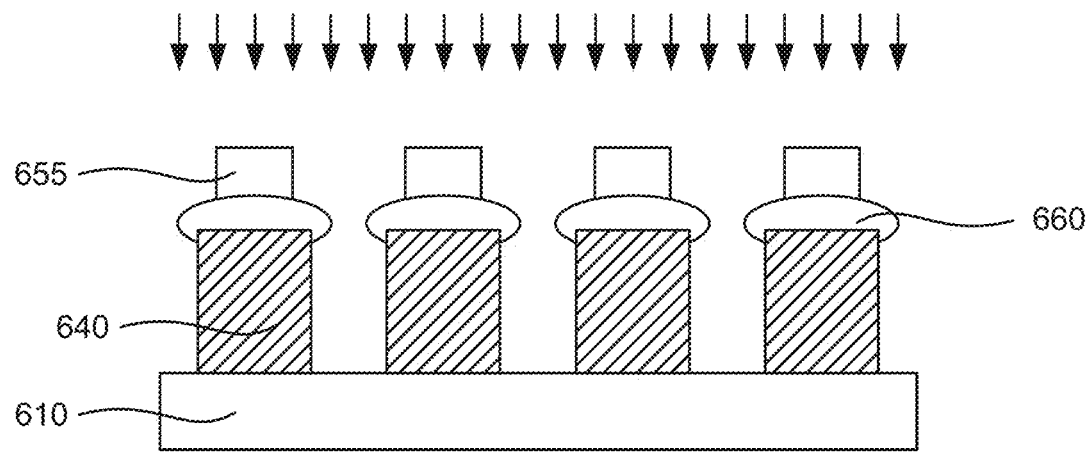

FIG. 6F illustrates a stage after the removal of the first and second photoresists 685, 695. In this stage, the exposed wetting barrier 660, may undergo a plasma treatment. For example, if the exposed wetting barrier 660 is formed from nickel, then the N2+O2 plasma treatment may be performed to further lower the solderability of the exposed wetting barrier 660 through oxidation.

Figure 6G:
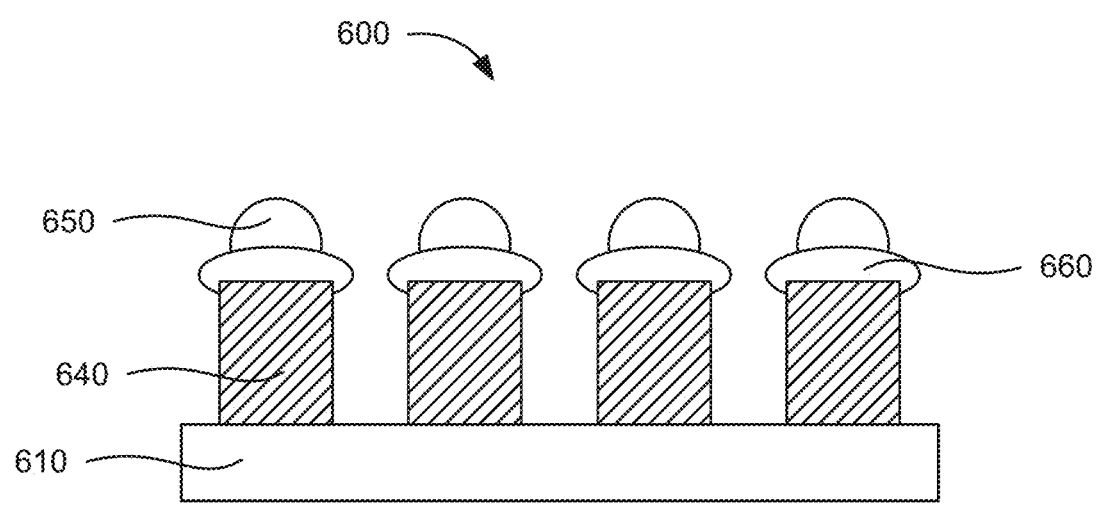

FIG. 6G illustrates a stage in which a seed layer etch and solder reflow may be performed, upon removal of the first and second photoresists 685, 695, to form the solder cap 650.

In an aspect, the stage of FIG. 6F may also be optional. That is, it may not be necessary to perform the plasma treatment. Then the process may skip stage of FIG. 6F, i.e., may proceed from stage of FIG. 6E to stage of FIG. 6G.

Figure 7A:
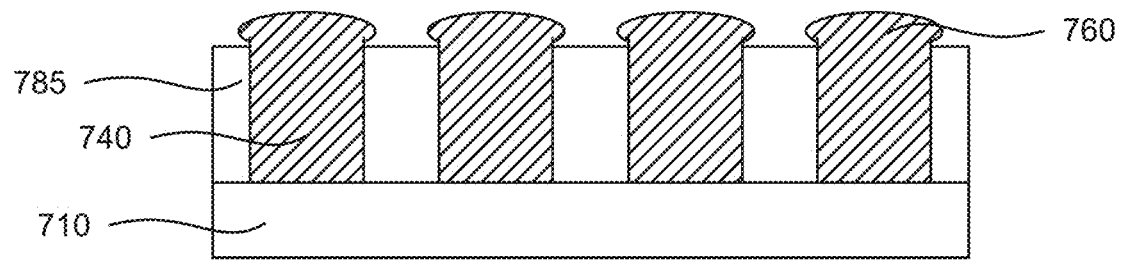
FIGS. 7A-7G illustrate examples of stages of fabricating a further IC structure in accordance with one or more aspects of the disclosure.

FIGS. 7A-7G illustrate stages of fabricating an IC structure 700. FIG. 7A illustrates a stage in which a pillar 740 and a wetting barrier 760 may be formed on a die 710 (e.g., FC die). The pillar 740 may be formed from conductive materials (e.g., Cu) on the die 710. A first surface (e.g., bottom surface) of the pillar 740 may face the die 710. For example, the first surface of the pillar 740 may be in contact with a side (e.g., active side) of the die 710. Also, a wetting barrier 760 may be formed on the pillar 740.

The process to arrive at the FIG. 7A stage may be as follows. Initially a first photoresist 785 may be deposited on the die 710. The first photoresist 785 may be patterned with a first opening corresponding to a contact (not shown) of the die 710. This may be followed by forming the pillar 740 within the first opening and up to a height of the first photoresist 785 such that the second surface of the pillar 740 is exposed at a top surface of the first photoresist 785. For example, the pillar 740 may be formed from electroplating a metal (e.g., Cu) up to the top surface of the first photoresist 785.

Thereafter, the wetting barrier 760 may be formed on the exposed second surface of the pillar 740. Electroplating with same or different conductive material may be continued on the pillar 740 above the height of the first photoresist 785 to form the wetting barrier 760. The wetting barrier 760 may be formed while the first photoresist 785 is still in place. Since there is no mask confinement above the first photoresist 785, the continued electroplating can result in a slight overgrowth in top side above the first photoresist 785 to form the overhang. As a result, the wetting barrier 760 can be wider than the pillar 740.

Figure 7B:
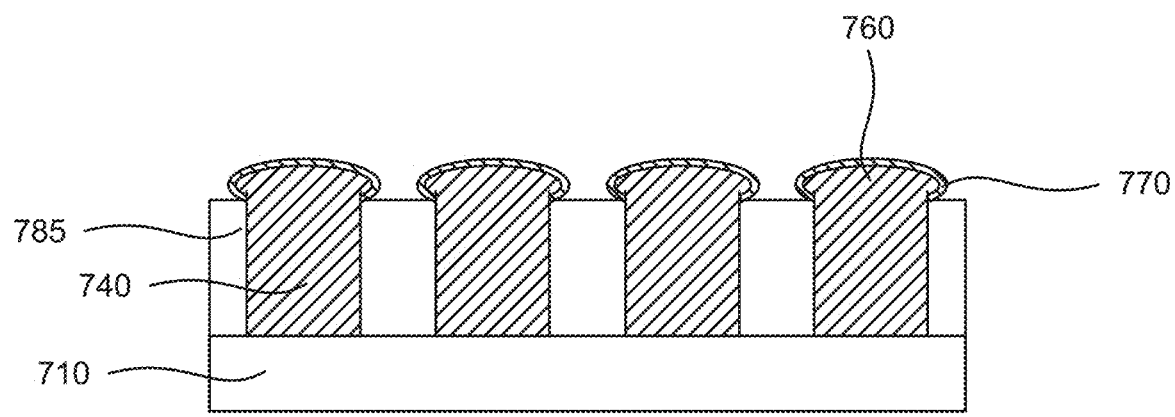

FIG. 7B illustrates a stage in which a low wetting layer 770 may be formed on exposed surface of the wetting barrier 760. Preferably, the low wetting layer 770 has a lower solderability than the pillar 740. For example, if the pillar 740 is formed from Cu, then the low wetting layer 770 may be formed by electroplating Al, Cr, etc. The low wetting layer 770 may also be formed with the first photoresist 785 is still in place.

Figure 7C:
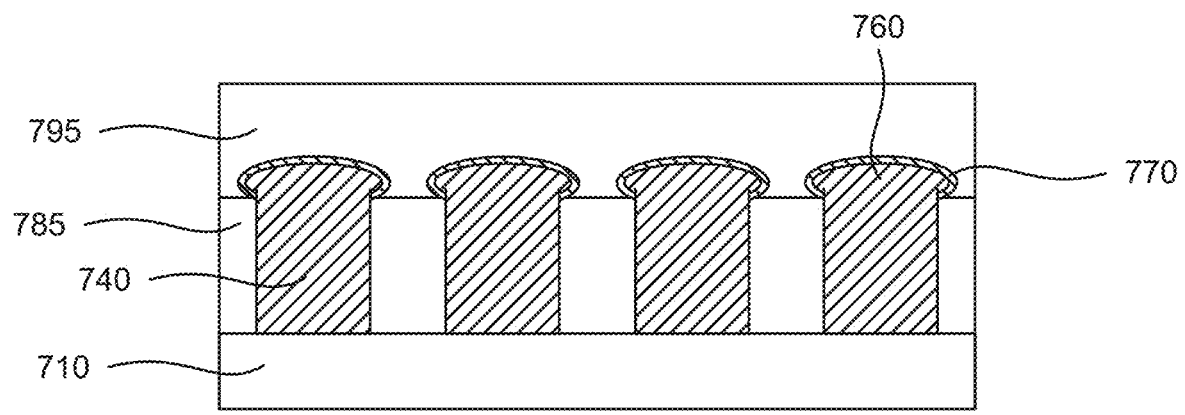

FIG. 7C illustrates a stage in which a second photoresist 795 may be deposited on the first photoresist 785 to cover the low wetting layer 770.

Figure 7D:
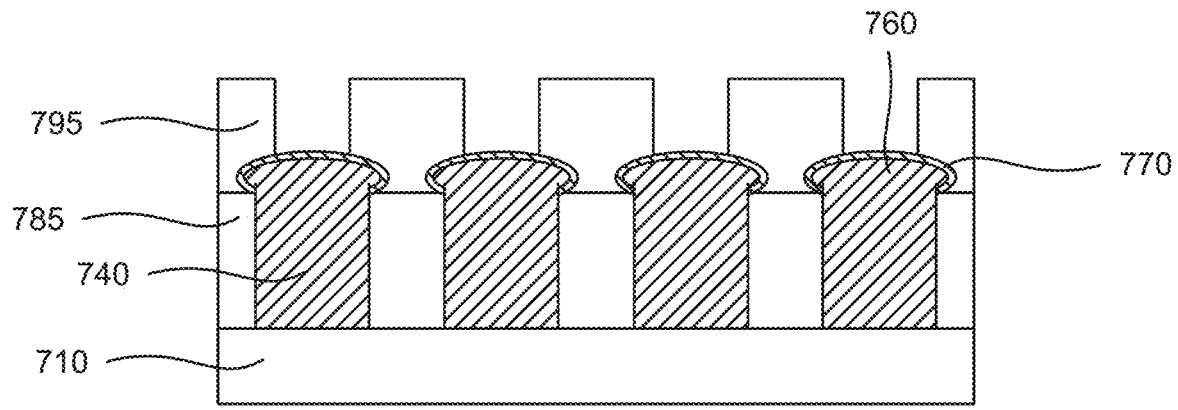

FIG. 7D illustrates a stage in which the second photoresist 795 may be patterned to form a second opening to expose a portion of the surface of the low wetting layer 770. A width of the second opening formed in the second photoresist 795 can be less than a width of the first opening formed in the first photoresist 785.

Figure 7E:
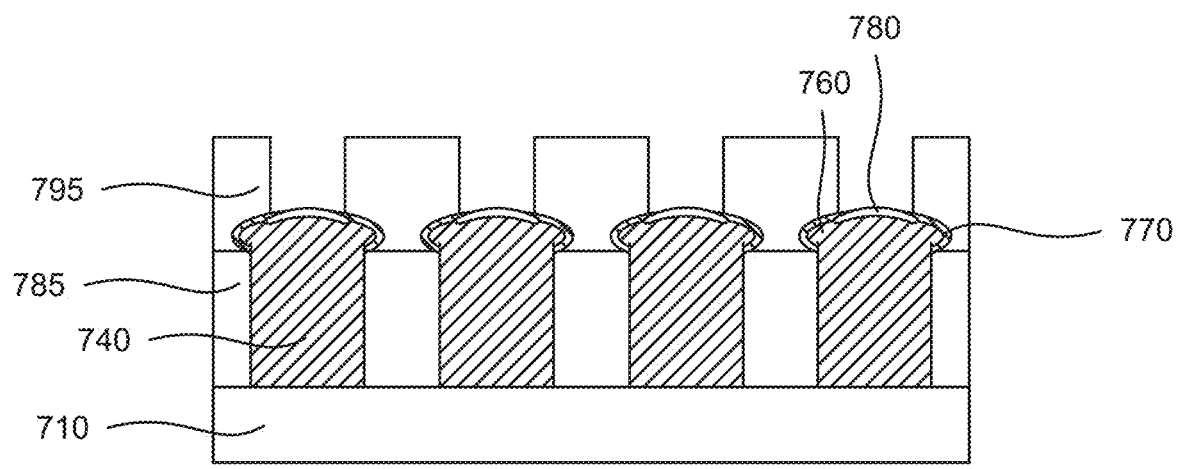

FIG. 7E illustrates a stage in which the exposed portion of the low wetting layer 770 may be etched to expose a portion of the wetting barrier 760. This may be followed by forming a contact layer 780 on the exposed portion of the wetting barrier 760. For example, the contact layer 780 may be formed by plating a conductive material such as Ni on the exposed portion of the wetting barrier 760.

Figure 7F:
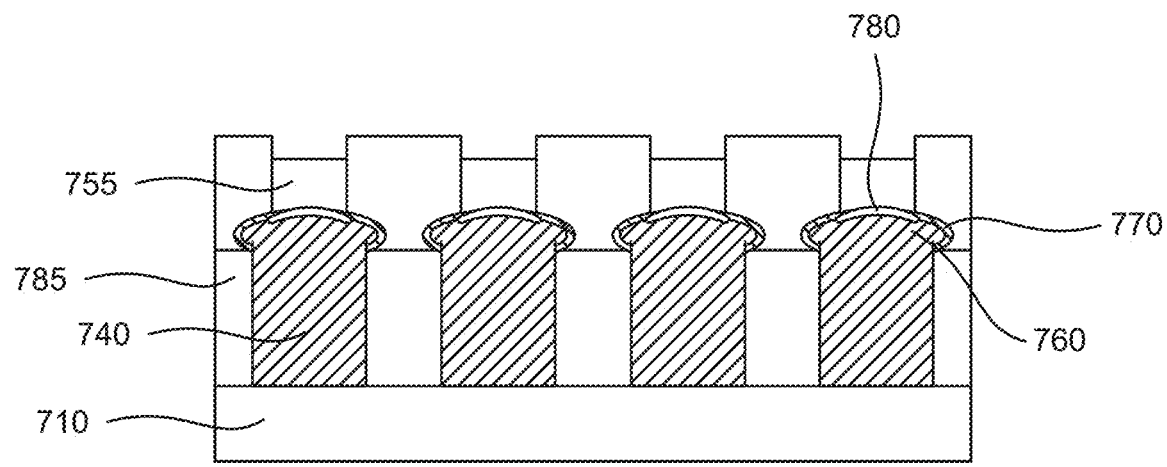

FIG. 7F illustrates a stage in which a solder material 755 may be deposited on the contact layer 780 within the second opening. For example, the solder material 755 may be electroplated on the contact layer 780. Thereafter, the first and second photoresists 785, 795 may be removed.

Figure 7G:
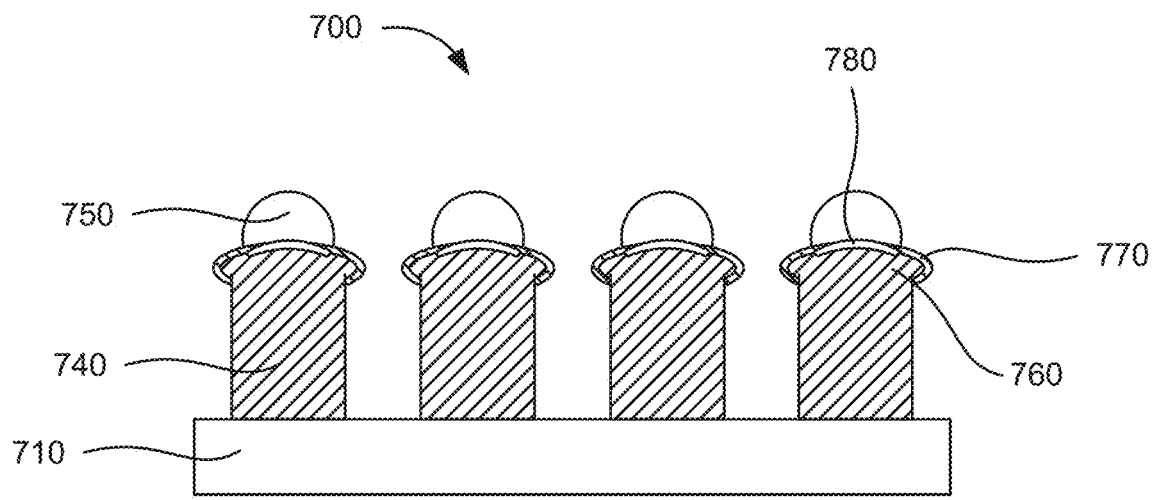

FIG. 7G illustrates a stage in which a seed layer etch and solder reflow may be performed, upon removal of the first and second photoresists 785, 795, to form the solder cap 750.

In an aspect, the stage of FIG. 7B may be optional. That is, the low wetting layer 770 need not be formed. Then the process may skip stage of FIG. 7A, i.e., may proceed from stage of FIG. 7A to stage of FIG. 7C. Also, if the low wetting layer 770 is not formed (i.e., stage of FIG. 7B is skipped), then after stage of FIG. 7D in which the second opening is formed in the second photoresist 785, the wetting barrier 760 would already be exposed. Thus, the process may proceed directly to forming the contact layer 780.

Figure 8A:
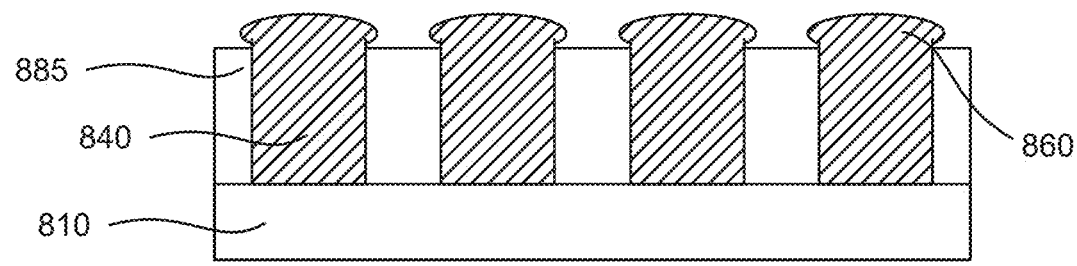
FIGS. 8A-8G illustrate examples of stages of fabricating a yet another IC structure in accordance with one or more aspects of the disclosure.

FIGS. 8A-8G illustrate stages of fabricating an IC structure 800. FIG. 8A illustrates a stage in which a first pillar 840 and a wetting barrier 860 may be formed on a die 810 (e.g., FC die). The first pillar 840 may be formed from conductive materials (e.g., Cu) on the die 810. A first surface (e.g., bottom surface) of the first pillar 840 may face the die 810. For example, the first surface of the first pillar 840 may be in contact with a side (e.g., active side) of the die 810. Also, a wetting barrier 860 may be formed on the first pillar 840.

The process to arrive at the FIG. 8A stage may be as follows. Initially a first photoresist 885 may be deposited on the die 810. The first photoresist 885 may be patterned with a first opening corresponding to a contact (not shown) of the die 810. This may be followed by forming the first pillar 840 within the first opening and up to a height of the first photoresist 885 such that the second surface of the first pillar 840 is exposed at a top surface of the first photoresist 885. For example, the first pillar 840 may be formed from electroplating a metal (e.g., Cu) up to the top surface of the first photoresist 885.

Thereafter, the wetting barrier 860 may be formed on the exposed second surface of the first pillar 840. Electroplating with same or different conductive material may be continued on the first pillar 840 above the height of the first photoresist 885 to form the wetting barrier 860. The wetting barrier 860 may be formed while the first photoresist 885 is still in place. Since there is no mask confinement above the first photoresist 885, the continued electroplating can result in a slight over-growth in top side above the first photoresist 885 to form the overhang. As a result, the wetting barrier 860 can be wider than the first pillar 840.

Figure 8B:
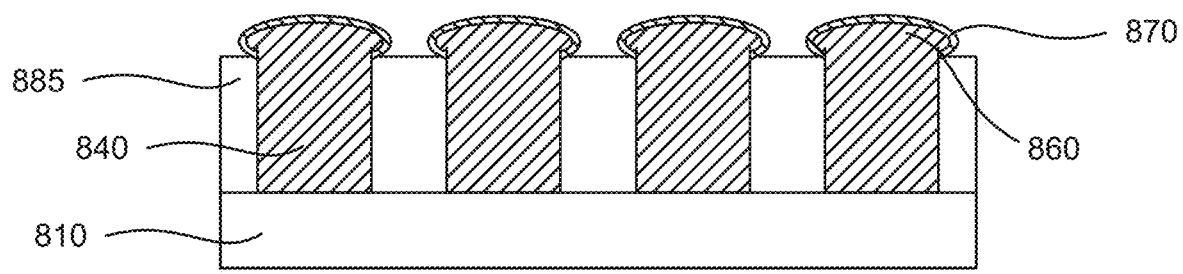

FIG. 8B illustrates a stage in which a low wetting layer 870 may be formed on exposed surface of the wetting barrier 860. Preferably, the low wetting layer 870 has a lower solderability than the first pillar 840. For example, if the first pillar 840 is formed from Cu, then the low wetting layer 870 may be formed by electroplating Al, Cr, etc. The low wetting layer 870 may also be formed with the first photoresist 885 is still in place.

Figure 8C:
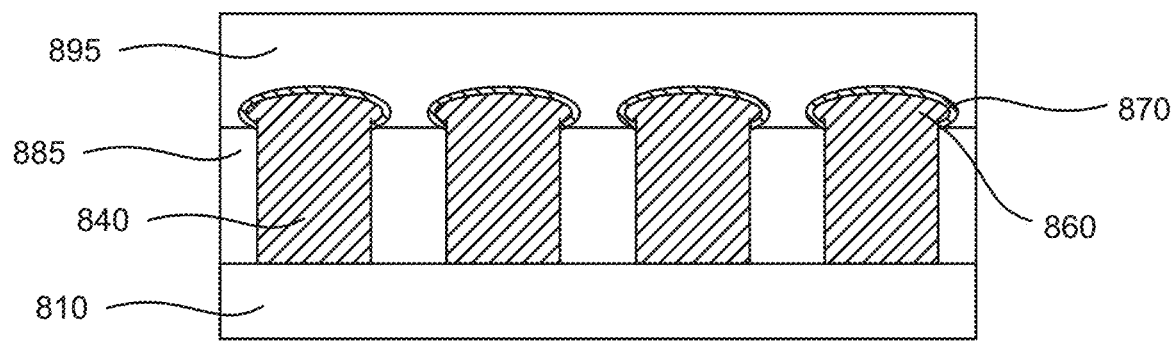

FIG. 8C illustrates a stage in which a second photoresist 895 may be deposited on the first photoresist 885 to cover the low wetting layer 870.

Figure 8D:
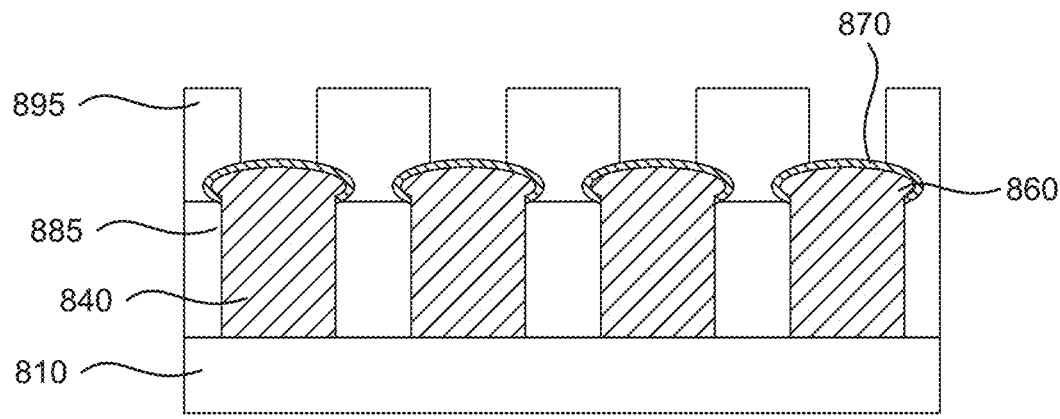

FIG. 8D illustrates a stage in which the second photoresist 895 may be patterned to form a second opening to expose a portion of the surface of the low wetting layer 870. A width of the second opening formed in the second photoresist 895 can be less than a width of the first opening formed in the first photoresist 885.

Figure 8E:
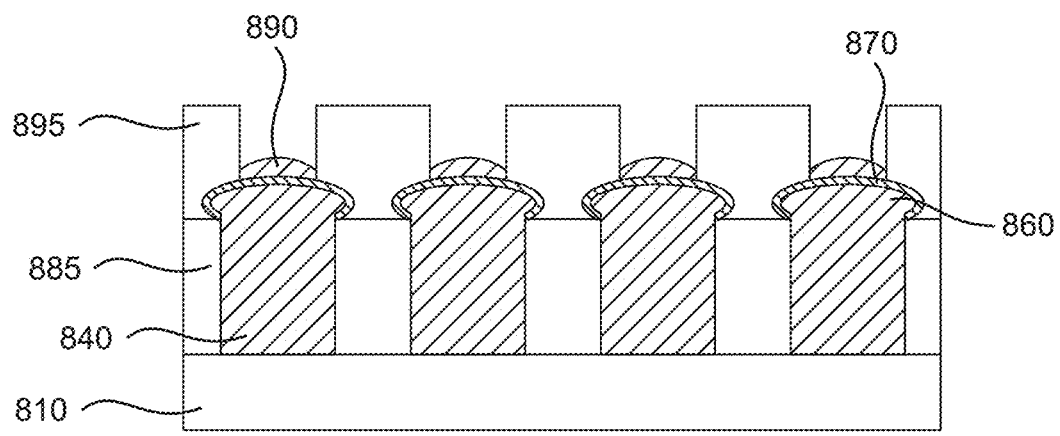

FIG. 8E illustrates a stage in which a second pillar 890 may be formed on the exposed portion of the low wetting layer 870 within the second opening. For example, a conductive material (e.g., Cu) may be plated on the low wetting layer 870 within the second opening.

Figure 8F:
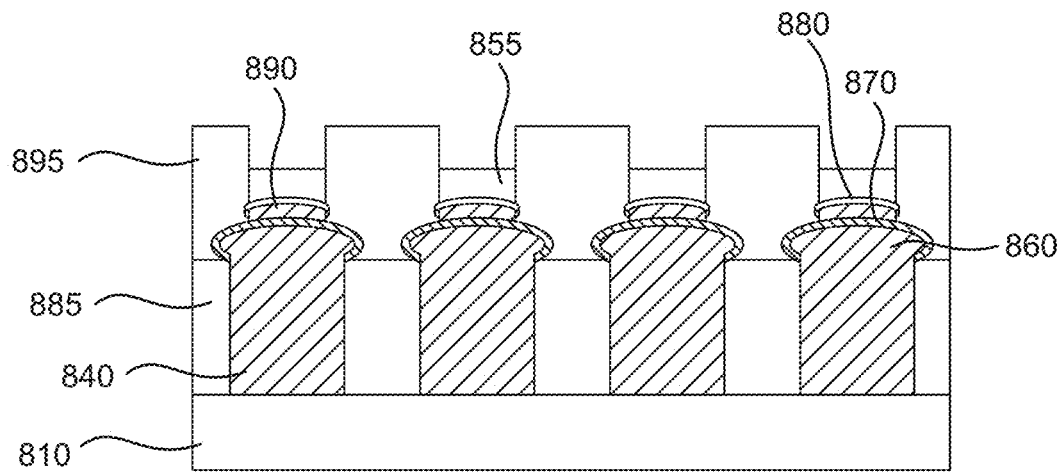

FIG. 8F illustrates a stage in which a contact layer 880 may be formed on the second pillar 890 within the second opening. For example, the contact layer 880 may be formed by plating a conductive material such as Ni on the second pillar 890.

In FIG. 8F, after forming the contact layer 880, solder material 855 may be deposited on the contact layer 880 within the second opening. For example, the solder material 855 may be electroplated on the contact layer 880. Thereafter, the first and second photoresists 885, 895 may be removed.

Figure 8G:
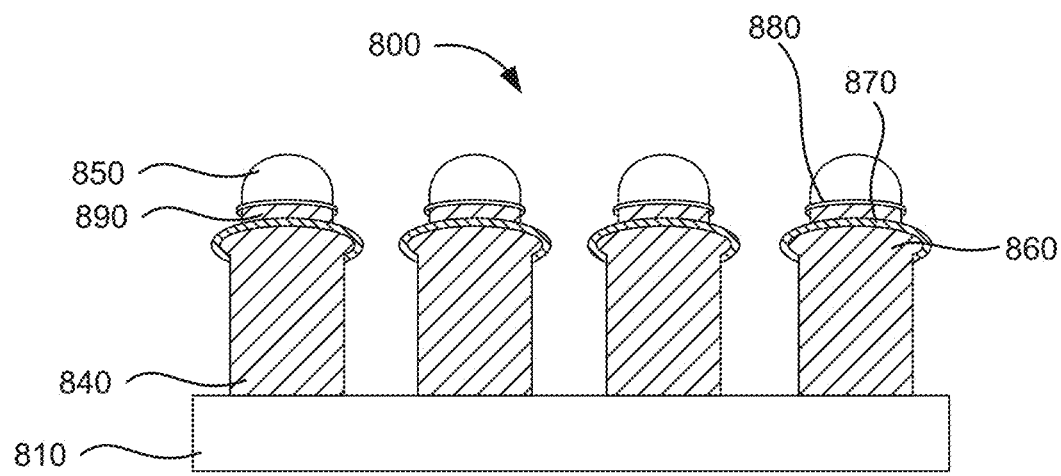

FIG. 8G illustrates a stage in which a seed layer etch and solder reflow may be performed, upon removal of the first and second photoresists 885, 895, to form the solder cap 850.

Figure 9A:
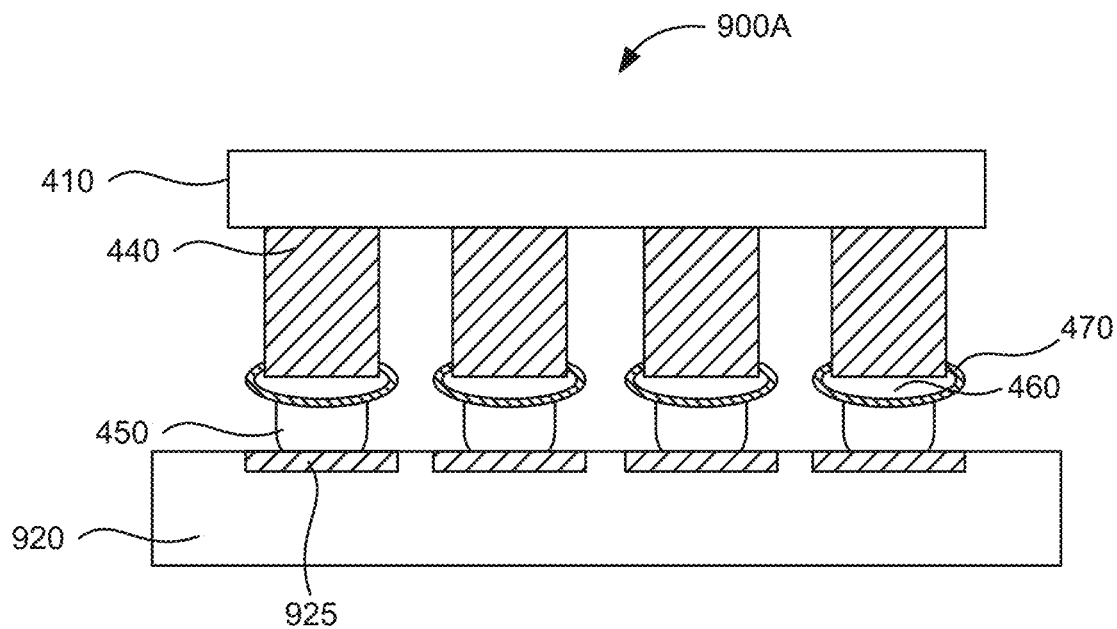
FIGS. 9A-9E illustrate examples of IC packages in accordance with one or more aspects of the disclosure.
Figure 9B:
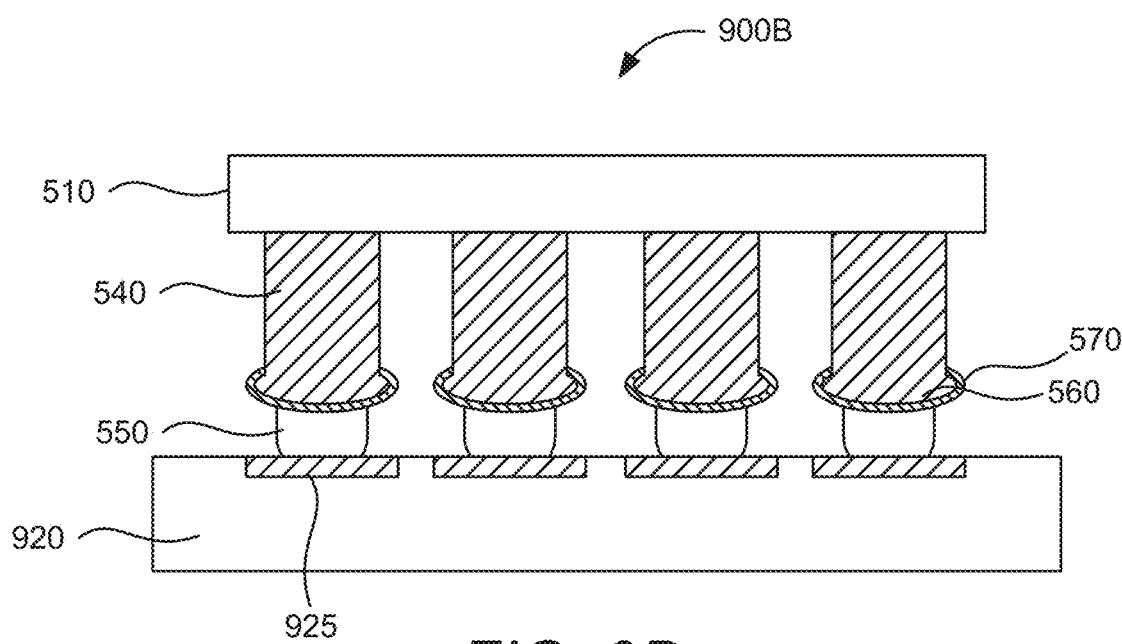
Figure 9C:
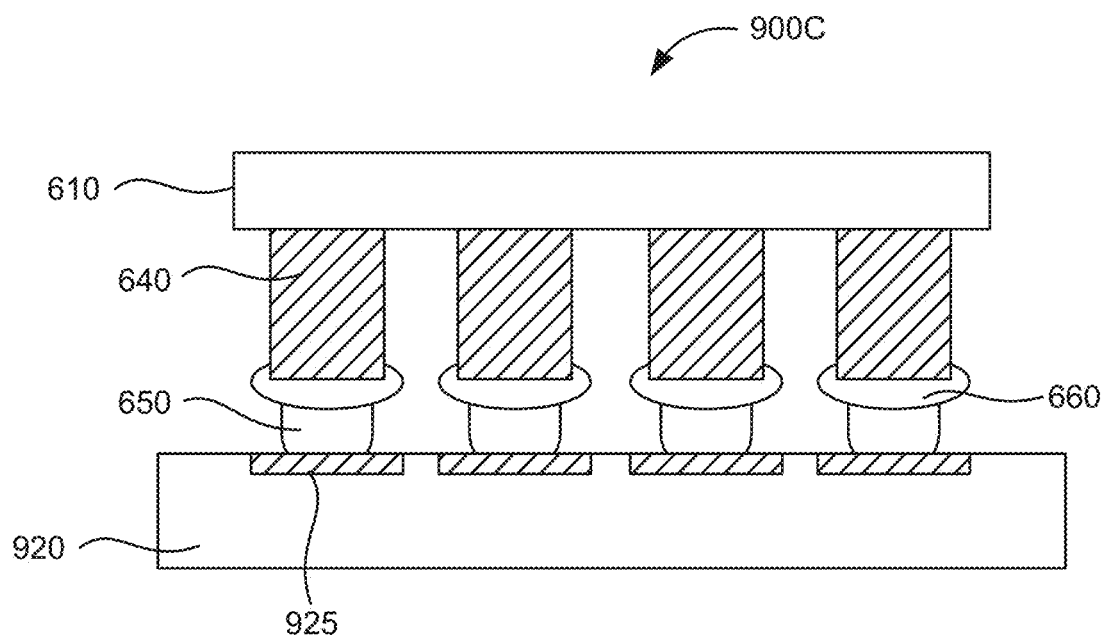
Figure 9D:
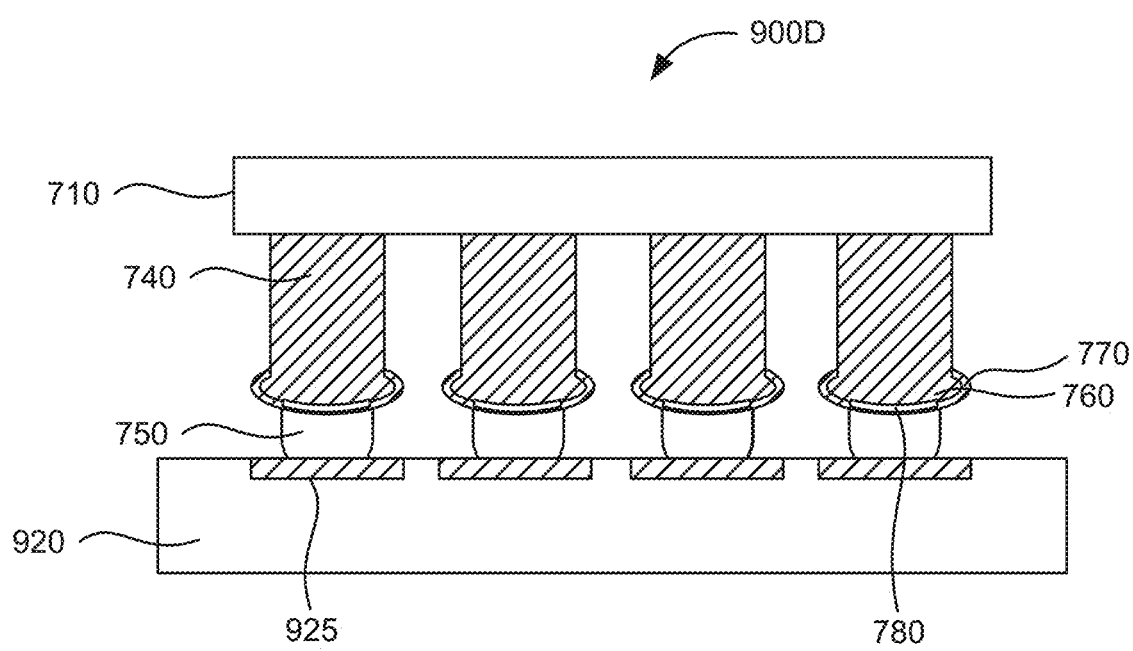
Figure 9E:
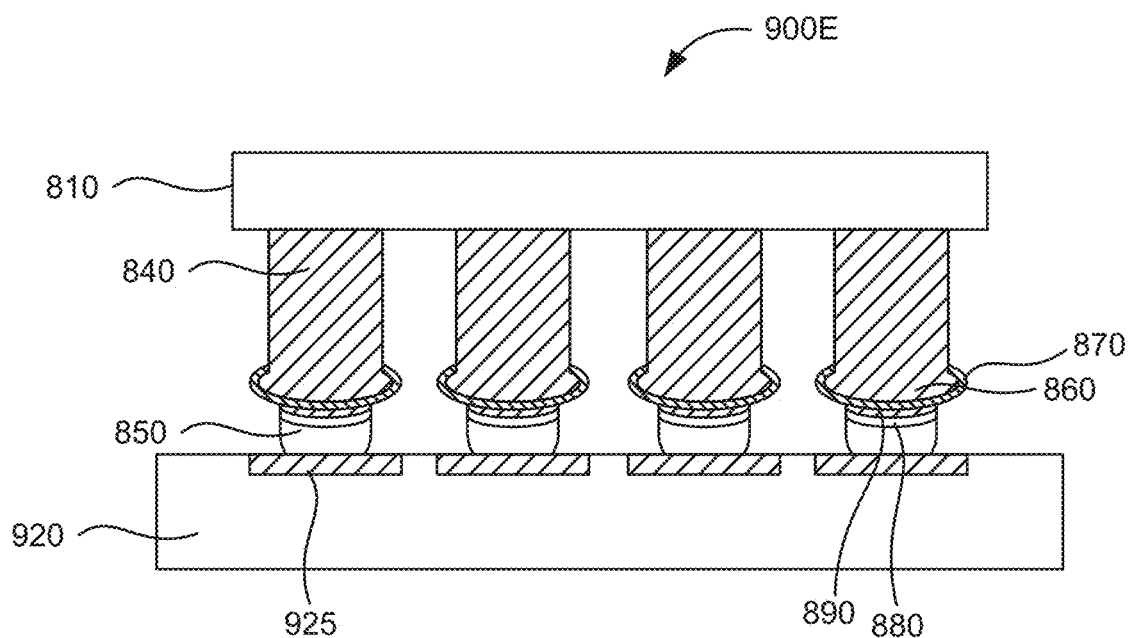

FIGS. 9A-9E illustrate different example embodiments of IC packages. FIG. 9A illustrates an IC package 900A that includes a substrate 920 (comprising conductive pads 925) with the IC structure 400 of FIG. 4. FIG. 9B illustrates an IC package 900B that includes a substrate 920 (comprising conductive pads 925) with the IC structure 500 of FIG. 5G. FIG. 9C illustrates an IC package 900C that includes a substrate 920 (comprising conductive pads 925) with the IC structure 600 of FIG. 6G. FIG. 9D illustrates an IC package 900D that includes a substrate 920 (comprising conductive pads 925) with the IC structure 700 of FIG. 7G. FIG. 9E illustrates an IC package 900E that includes a substrate 920 (comprising conductive pads 925) with the IC structure 800 of FIG. 8G. Note that in each of the IC packages 900A-900E, the die 410, 510, 610, 710, 810 may be electrically coupled to the conductive pad 925 of the substrate 920 at least through the solder cap 450, 550, 650, 750, 850, the pillar 440, 540, 640, 740, 840, and the wetting barrier 460, 560, 660, 760, 860.

Figure 10:
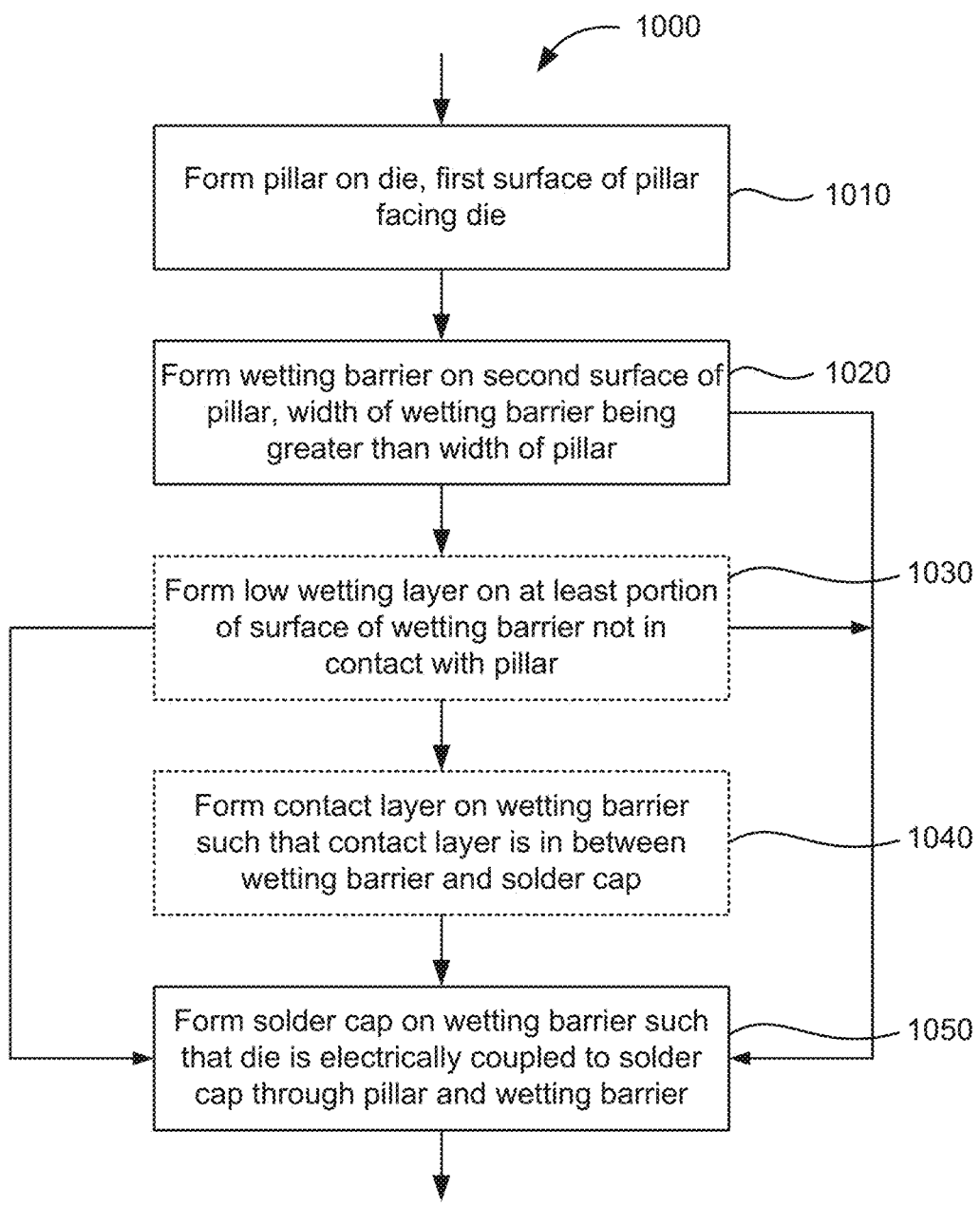
FIGS. 10-18 illustrate flow charts of an example method of manufacturing an IC structure in accordance with at one or more aspects of the disclosure.

FIG. 10 illustrates a flow chart of an example method 1000 of fabricating an IC structure such as any of the IC structures 400, 500, 600, 700, 800. In block 1010, a pillar may be formed on a die such that a first face of the pillar faces the die.

In block 1020, a wetting barrier may be formed on a second surface of the pillar. The wetting may be formed such that a width of the wetting barrier is greater than a width of the pillar.

Figure 11:
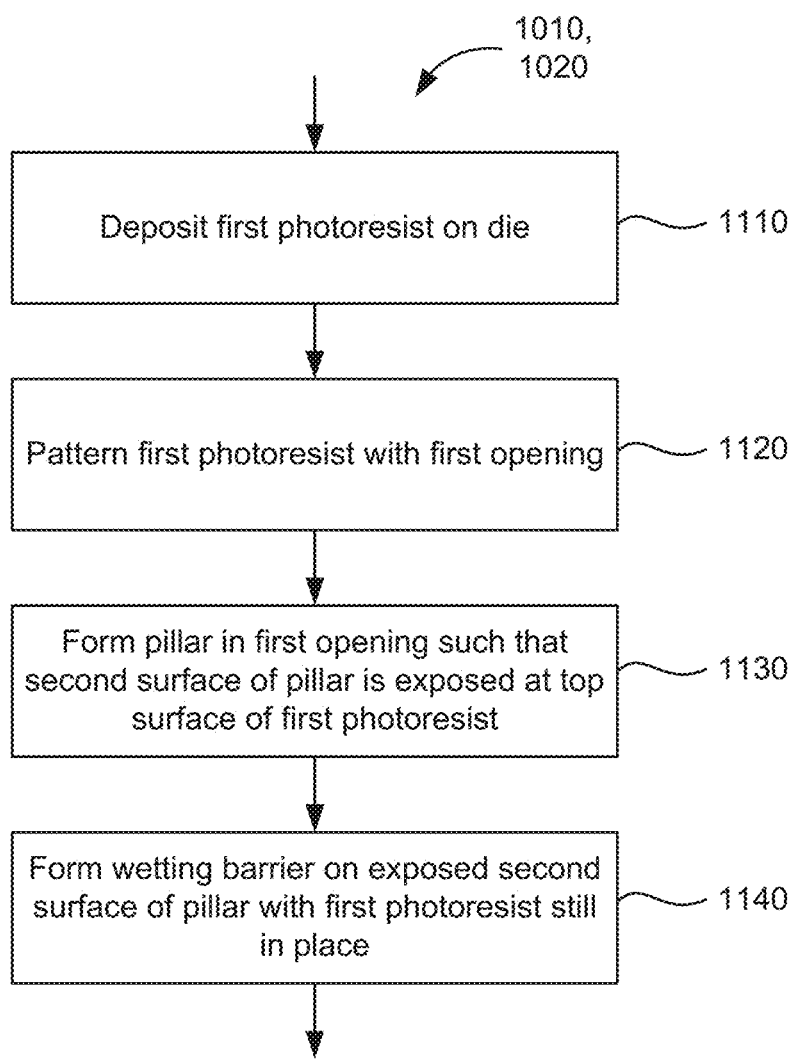

FIG. 11 illustrates a flow chart of an example process to implement blocks 1010 and 1020. In block 1110, a first photoresist may be deposited on the die. In block 1120, the first photoresist may be patterned with a first opening, which may correspond to a contact of the die. In block 1130, the pillar may be formed within the first opening such that the second surface of the pillar is exposed at a top surface of the first photoresist. For example, the pillar may be formed from electroplating a conductive material (e.g., Cu) up to the top surface of the first photoresist. In an aspect, blocks 1110, 1120, 1130 may correspond to FIGS. 5A, 6A, 7A, 8A.

In block 1140, a wetting barrier may be formed on the exposed second surface of the pillar. For example, the wetting barrier may be formed by plating a conductive material on the pillar while the first photoresist remains in place. The wetting barrier may be formed from same or different material as the pillar. In an aspect, block 1140 may correspond to FIGS. 5A, 6B, 7A, 8A.

Referring back to FIG. 10, in an aspect, the method 1000 may proceed from block 1020 to block 1050. In block 1050, a solder cap may be formed on the wetting barrier such that the die is electrically coupled to the solder cap at least through the pillar and the wetting barrier.

Figure 12:
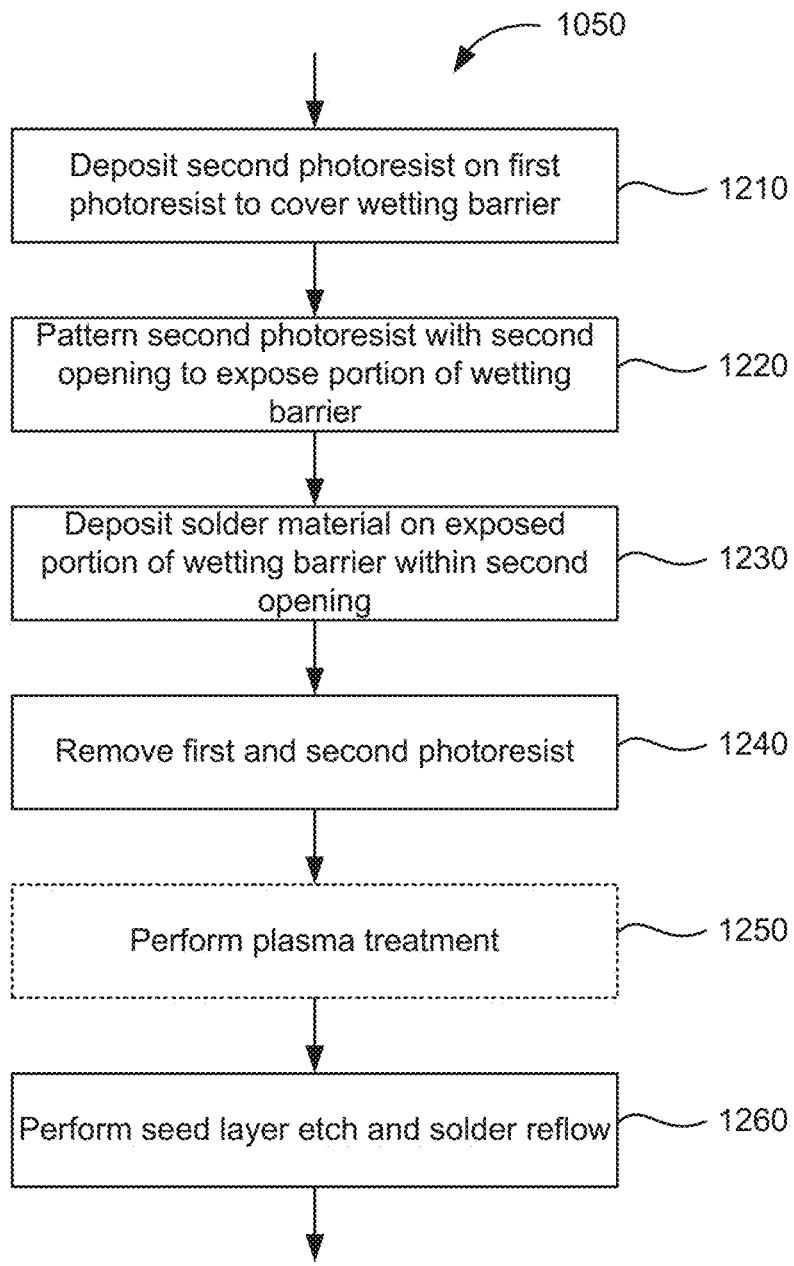

FIG. 12 illustrates a flow chart of an example process to implement block 1050 when proceeding from block 1020. In block 1210, a second photoresist may be deposited on the first photoresist to cover the wetting barrier. In an aspect, block 1210 may correspond to FIG. 6C.

In block 1220, the second photoresist may be patterned with a second opening to expose a portion the wetting barrier. A width of the second opening may be less than a width of the first opening. In an aspect, block 1220 may correspond to FIG. 6D.

In block 1230, a solder material may be deposited on the exposed portion of the wetting barrier within the second opening. In an aspect, block 1230 may correspond to FIG. 6E.

After depositing the solder material, in block 1240, the first and second photoresists may be removed. Thereafter, in block 1250 (which may be optional), plasma treatment may be performed. In an aspect, blocks 1240 and 1250 may correspond to FIG. 6F.

After block 1240 or 1250, in block 1260, a seed layer etch and a solder reflow may be performed. In an aspect, block 1260 may correspond to FIG. 6G.

Referring back to FIG. 10, in another aspect, the method 1000 may proceed from block 1020 to block 1030 before proceeding to block 1050. In block 1030, a low wetting layer may be formed on at least a portion of a surface of the wetting barrier that is not covered by the pillar. Preferably, low wetting layer has a lower solderability than the pillar.

Figure 13:
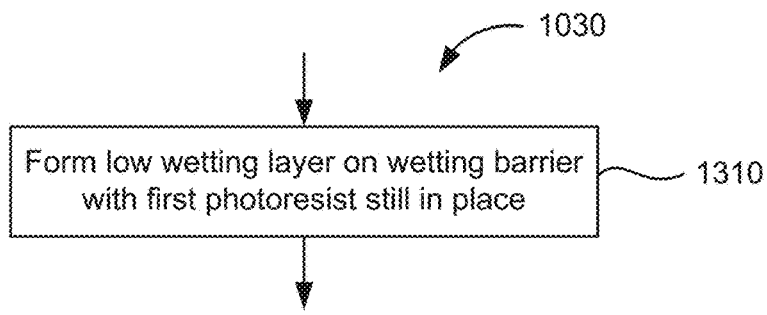

FIG. 13 illustrates a flow chart of an example process to implement block 1030. In block 1310, the low wetting layer may be formed on the wetting barrier while the first photoresist is still in place. In an aspect, block 1310 may correspond to FIGS. 5B, 7B, 8B.

Referring back to FIG. 10, in a further aspect, the method 1000 may proceed from block 1030 to block 1050. As indicated before, in block 1050, a solder cap may be formed on the wetting barrier such that the die is electrically coupled to the solder cap at least through the pillar and the wetting barrier.

Figure 14:
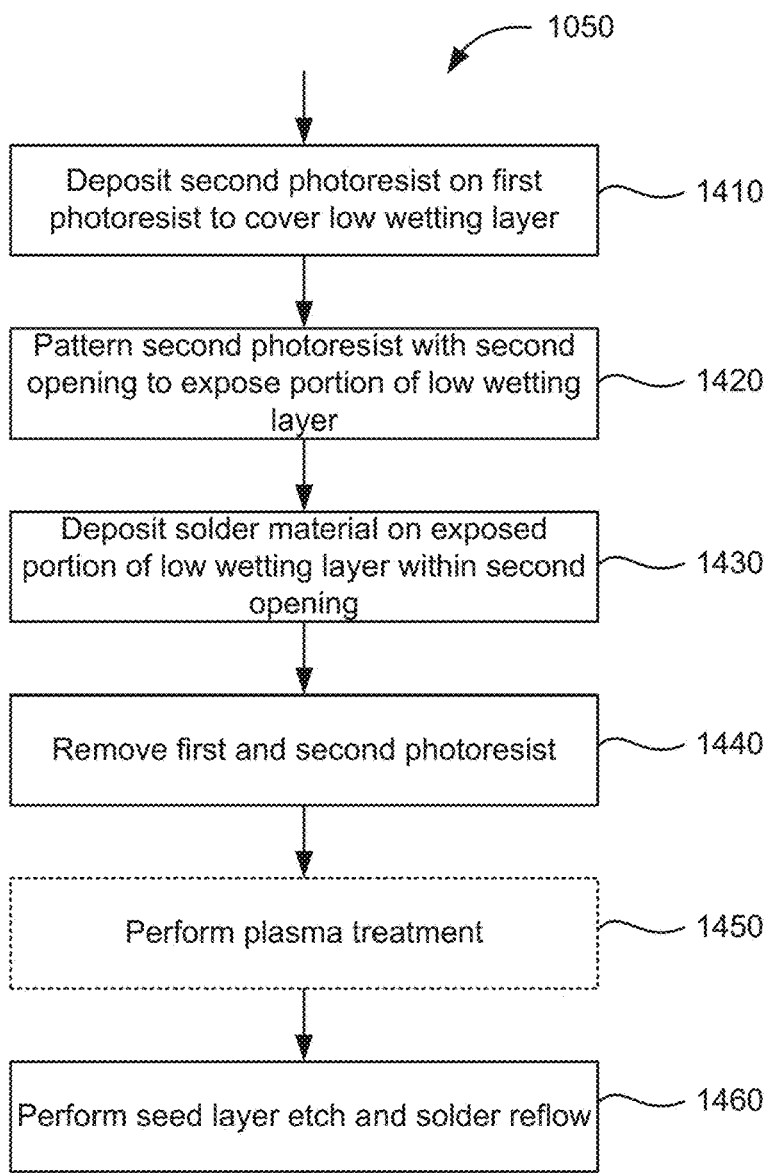

FIG. 14 illustrates a flow chart of an example process to implement block 1050 when proceeding from block 1030. In block 1410, a second photoresist may be deposited on the first photoresist to cover the low wetting layer. In an aspect, block 1410 may correspond to FIG. 5C.

In block 1420, the second photoresist may be patterned with a second opening to expose a portion the low wetting layer. A width of the second opening may be less than a width of the first opening. In an aspect, block 1420 may correspond to FIG. 5D.

In block 1430, a solder material may be deposited on the exposed portion of the low wetting layer within the second opening. In an aspect, block 1430 may correspond to FIG. 5E.

After depositing the solder material, in block 1440, the first and second photoresists may be removed. Thereafter, in block 1450 (which may be optional), plasma treatment may be performed. In an aspect, blocks 1440 and 1450 may correspond to FIG. 5F.

After block 1440 or 1450, in block 1460, a seed layer etch and a solder reflow may be performed. In an aspect, block 1460 may correspond to FIG. 5G.

Referring back to FIG. 10, in a yet another aspect, the method 1000 may proceed from block 1030 to block 1040. In block 1040, a contact layer may be formed on the wetting barrier such that the contact layer is in between the wetting barrier and the solder cap.

Figure 15:
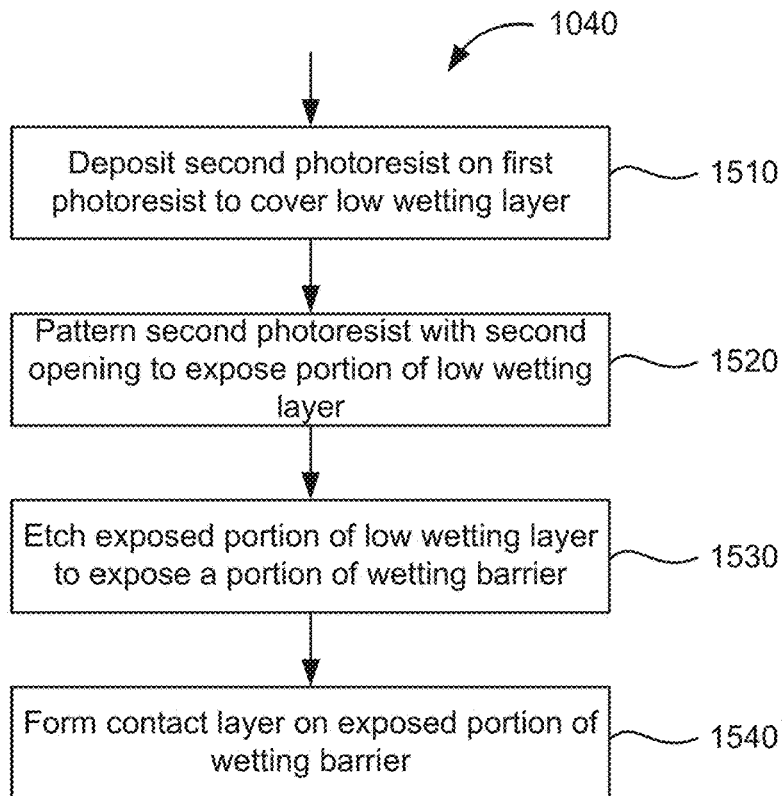

FIG. 15 illustrates a flow chart of an example process to implement block 1040. In block 1510, a second photoresist may be deposited on the first photoresist to cover the low wetting layer. In an aspect, block 1510 may correspond to FIG. 7C.

In block 1520, the second photoresist may be patterned with a second opening to expose a portion of the surface of the low wetting layer. A width of the second opening may be less than a width of the first opening. In an aspect, block 1520 may correspond to FIG. 7D.

In block 1530, the exposed portion of the low wetting layer may be etched to expose a portion of the wetting barrier. In block 1540, the contact layer may be formed on the exposed portion of the wetting barrier. For example, conductive material (e.g., Ni) may be plated on the exposed portion of the wetting barrier. In an aspect, blocks 1530 and 1540 may correspond to FIG. 7E.

Referring back to FIG. 10, the method may proceed from block 1040 to block 1050. As indicated before, in block 1050, a solder cap may be formed on the wetting barrier such that the die is electrically coupled to the solder cap at least through the pillar and the wetting barrier.

Figure 16:
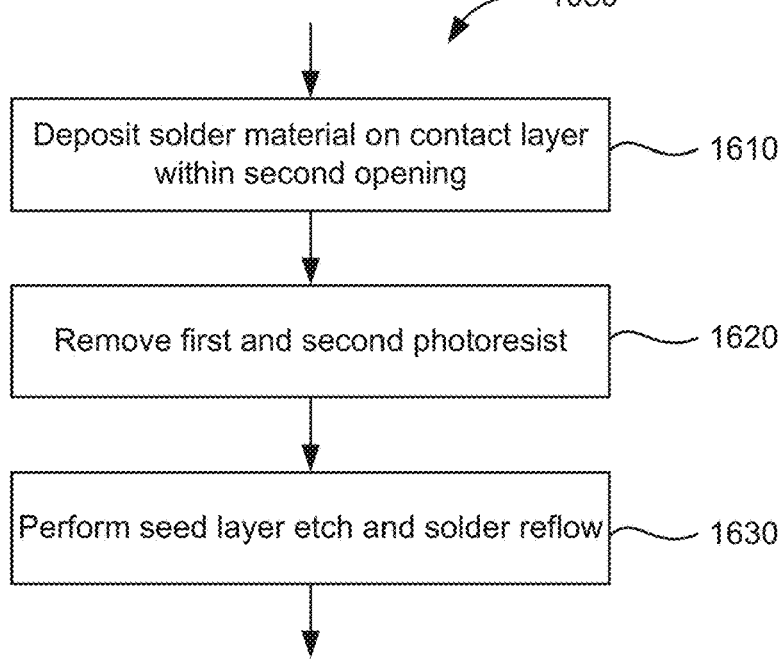

FIG. 16 illustrates a flow chart of an example process to implement block 1050 when proceeding from block 1040. In block 1610, a solder material may be deposited on the contact layer within the second opening. In an aspect, block 1610 may correspond to FIG. 7F.

After depositing the solder material, in block 1620, the first and second photoresists may be removed. Thereafter, in block 1630, a seed layer etch and a solder reflow may be performed. In an aspect, blocks 1620 and 1630 may correspond to FIG. 7G.

Figure 17:
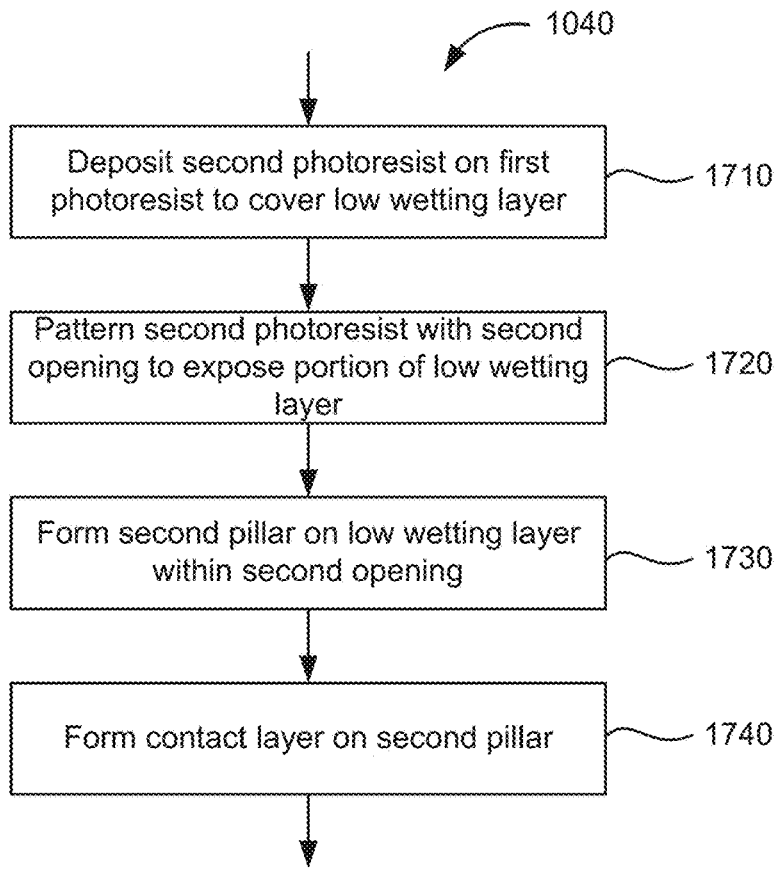

FIG. 17 illustrates a flow chart of another example process to implement block 1040 of FIG. 10. In this example process, another pillar is formed. Thus, for ease of distinction, the pillar formed in block 1010 will be referred to as the first pillar. Then the low wetting layer may be formed on the first pillar.

In block 1710, a second photoresist may be deposited on the first photoresist to cover the low wetting layer. In an aspect, block 1710 may correspond to FIG. 8C.

In block 1720, the second photoresist may be patterned with a second opening to expose a portion of the surface of the low wetting layer. A width of the second opening may be less than a width of the first opening. In an aspect, block 1720 may correspond to FIG. 8D.

In block 1730, a second pillar may be formed on the low wetting layer within the second opening. For example, a conductive material (e.g., Cu) may be plated on the exposed portion of the low wetting layer. In an aspect, block 1730 may correspond to FIG. 8E.

In block 1740, the contact layer may be formed on the second pillar. For example, conductive material (e.g., Ni) may be plated on the contact layer. In an aspect, block 1740 may correspond to FIG. 8F.

Figure 18:
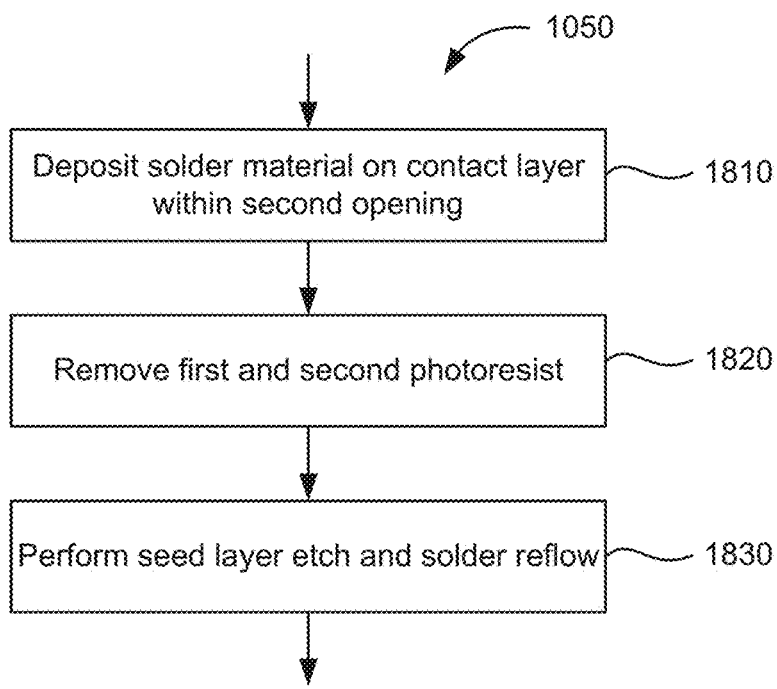

FIG. 18 illustrates a flow chart of an example process to implement block 1050 when proceeding from block 1040 as implemented through blocks of FIG. 17. In block 1810, a solder material may be deposited on the contact layer within the second opening. In an aspect, block 1810 may also correspond to FIG. 8F.

After depositing the solder material, in block 1820, the first and second photoresists may be removed. Thereafter, in block 1830, a seed layer etch and a solder reflow may be performed. In an aspect, blocks 1820 and 1830 may correspond to FIG. 8G.

Figure 19:
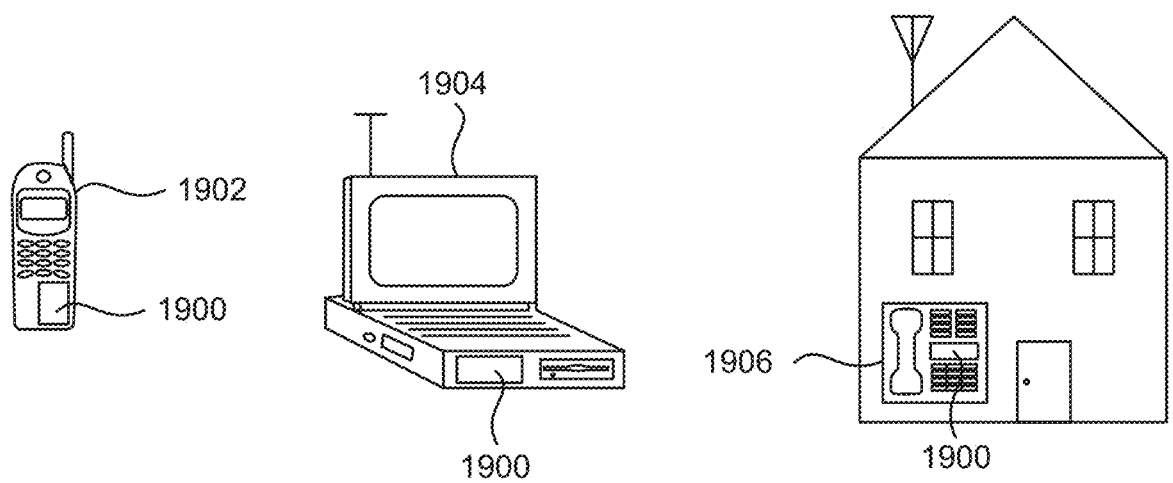
FIG. 19 illustrates various electronic devices which may utilize one or more aspects of the disclosure.

FIG. 19 illustrates various electronic devices that may be integrated with any of the aforementioned IC packages and structures 400, 500, 600, 700, 800, 900A, 900B, 900C, 900D, 900E in accordance with various aspects of the disclosure. For example, a mobile phone device 1902, a laptop computer device 1904, and a fixed location terminal device 1906 may each be considered generally as user equipment (UE) and may include an apparatus 1900 that incorporates the IC packages and structures 400, 500, 600, 700, 800, 900A, 900B, 900C, 900D, 900E as described herein. The devices 1902, 1904, 1906 illustrated in FIG. 19 are merely exemplary. Other electronic devices may also include the IC packages and structures 400, 500, 600, 700, 800, 900A, 900B, 900C, 900D, 900E including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles, an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged as described herein.

Implementation examples are described in the following numbered clauses:

Clause 1: An integrated circuit (IC) structure, comprising: a die; a pillar on the die, a first surface of the pillar facing the die; a wetting barrier on a second surface of the pillar, a width of the wetting barrier being greater than a width of the pillar; and a solder cap on the wetting barrier such that the die is electrically coupled to the solder cap at least through the pillar and the wetting barrier.

Clause 2: The IC structure of Clause 1, further comprising: a low wetting layer on at least a portion of a surface of the wetting barrier not covered by the pillar.

Clause 3: The IC structure of Clause 2, wherein the low wetting layer has a lower solderability than the pillar.

Clause 4: The IC structure of any of Clauses 2-3, wherein the low wetting layer is formed from any combination of nickel (Ni), aluminum (Al), and chromium (Cr).

Clause 5: The IC structure of any of Clauses 2-4, wherein the low wetting layer is formed in between the wetting barrier and the solder cap.

Clause 6: The IC structure any of Clauses 2-5, wherein the pillar is a first pillar, and wherein the IC structure further comprises: a second pillar on the low wetting layer; and a contact layer in between the second pillar and the solder cap.

Clause 7: The IC structure of Clause 6, wherein the contact layer is formed from nickel
(Ni).

Clause 8: The IC structure any of Clauses 2-5, further comprising: a contact layer in between the wetting barrier and the solder cap.

Clause 9: The IC structure of Clause 8, wherein the contact layer is formed from nickel (Ni).

Clause 10: The IC structure any of Clauses 2-9, wherein the width of the wetting barrier is greater than a width of the solder cap.

Clause 11: The IC structure any of Clauses 2-10, wherein the pillar and the wetting barrier are formed from a same conductive material.

Clause 12: The IC structure of Clause 11, wherein the pillar and the wetting barrier are formed from copper (Cu).

Clause 13: The IC structure of any of Clauses 2-10, wherein the pillar and the wetting barrier are formed from different conductive materials.

Clause 14: The IC structure Clause 13, wherein the pillar is formed from copper (Cu), and wherein the wetting barrier are formed from nickel (Ni).

Clause 15: The IC structure any of Clauses 2-14, wherein the IC structure is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 16: A method of fabricating an integrated circuit (IC) structure, the method comprising: forming a pillar on a die, a first surface of the pillar facing the die; forming a wetting barrier on a second surface of the pillar, a width of the wetting barrier being greater than a width of the pillar; and forming a solder cap on the wetting barrier such that the die is electrically coupled to the solder cap at least through the pillar and the wetting barrier.

Clause 17: The method of Clause 16, wherein forming the pillar and forming the wetting barrier comprise: depositing a first photoresist on the die; patterning the first photoresist with a first opening; forming the pillar in the first opening such that the second surface of the pillar is exposed at a top surface of the first photoresist; and forming the wetting barrier on the exposed second surface of the pillar with the first photoresist in place.

Clause 18: The method of Clause 17, wherein the pillar is formed by plating copper (Cu) in the first opening, or wherein the wetting barrier is formed by plating Cu or nickel (Ni) on the pillar, or both.

Clause 19: The method of any of Clauses 17-18, wherein forming the solder cap comprises: depositing a second photoresist on the first photoresist to cover the wetting barrier; patterning the second photoresist with a second opening to expose a portion the wetting barrier, a width of the second opening being less than a width of the first opening; depositing a solder material on the exposed portion of the wetting barrier within the second opening; removing the first and second photoresists subsequent to depositing the solder material; and performing a seed layer etch and a solder reflow subsequent to removing the first and second photoresists.

Clause 20: The method of Clause 19, wherein forming the solder cap further comprises:
performing a plasma treatment of the wetting barrier subsequent to removing the first and second photoresists and prior to performing the seed layer etch and the solder reflow.

Clause 21: The method of any of Clauses 17-18, further comprising: forming a low wetting layer on at least a portion of a surface of the wetting barrier not covered by the pillar, wherein the low wetting layer has a lower solderability than the pillar.

Clause 22: The method of Clause 21, wherein the low wetting layer is formed from any combination of nickel (Ni), aluminum (Al), and chromium (Cr).

Clause 23: The method of any of Clauses 21-22, wherein forming the low wetting layer comprises: forming the low wetting layer on the wetting barrier with the first photoresist still in place, and wherein forming the solder cap comprises: depositing a second photoresist on the first photoresist to cover the low wetting layer; patterning the second photoresist with a second opening to expose a portion of the surface of the low wetting layer, a width of the second opening being less than a width of the first opening; depositing a solder material on the exposed portion of the low wetting layer within the second opening; removing the first and second photoresists subsequent to depositing the solder material; and performing a seed layer etch and a solder reflow subsequent to removing the first and second photoresists.

Clause 24: The method of Clause 23, wherein forming the solder cap further comprises:
performing a plasma treatment of the wetting barrier subsequent to removing the first and second photoresists and prior to performing the seed layer etch and the solder reflow.

Clause 25: The method of any of Clauses 17-18, further comprising: forming a contact layer on the wetting barrier such that the contact layer is in between the wetting barrier and the solder cap.

Clause 26: The method of Clause 25, wherein forming the contact layer comprises:
depositing a second photoresist on the first photoresist to cover the low wetting layer;
patterning the second photoresist with a second opening to expose a portion of the surface of the low wetting layer, a width of the second opening being less than a width of the first opening; etching the exposed portion of the low wetting layer to expose a portion of the wetting barrier; and forming the contact layer on the exposed portion of the wetting barrier, and wherein forming the solder cap comprises: depositing a solder material on the contact layer within the second opening; removing the first and second photoresists subsequent to depositing the solder material; and performing a seed layer etch and a solder reflow subsequent to removing the first and second photoresists.

Clause 27: The method of Clause 26, wherein the contact layer is formed by plating nickel (Ni) on the exposed portion of the wetting barrier.

Clause 28: The method of Clause 25, wherein the pillar is a first pillar, wherein forming the contact layer comprises: depositing a second photoresist on the first photoresist to cover the low wetting layer; patterning the second photoresist with a second opening to expose a portion of the surface of the low wetting layer, a width of the second opening being less than a width of the first opening; form a second pillar on the low wetting layer within the second opening; and forming the contact layer on the second pillar, and wherein forming the solder cap comprises: depositing a solder material on the contact layer within the second opening; removing the first and second photoresists subsequent to depositing the solder material; and performing a seed layer etch and a solder reflow subsequent to removing the first and second photoresists.

Clause 29: The method of Clause 28, wherein the second pillar is formed by plating copper (Cu) on the low wetting layer, or wherein the contact layer is formed by plating nickel (Ni) on the second pillar, or both.

Clause 30: An integrated circuit (IC) package, comprising: a substrate comprising a conductive pad; and an IC structure disposed on the substrate, the IC structure comprising: a die; a pillar on the die, a first surface of the pillar facing the die; a wetting barrier on a second surface of the pillar, a width of the wetting barrier being greater than a width of the pillar; and a solder cap on the wetting barrier such that the die is electrically coupled to the conductive pad of the substrate at least through the solder cap, the pillar, and the wetting barrier.

Clause 31: The IC package of Clause 30, wherein the IC structure further comprises: a low wetting layer on at least a portion of a surface of the wetting barrier not covered by the pillar, the low wetting layer having greater resistance to solder wetting than then the pillar.

Clause 32: An integrated circuit (IC) package, comprising: a substrate comprising a conductive pad; and an IC structure disposed on the substrate, the IC structure being any of Clauses 1-14.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An integrated circuit (IC) structure, comprising:
a die;
a pillar on the die, a first surface of the pillar facing the die;
a wetting barrier on a second surface of the pillar, a width of the wetting barrier being greater than a width of the pillar; and
a solder cap on the wetting barrier such that the die is electrically coupled to the solder cap at least through the pillar and the wetting barrier,
wherein the pillar and the wetting barrier are formed from a same conductive material, and wherein the width of the wetting barrier is greater than a width of the solder cap.

2. The IC structure of claim 1, further comprising:
a low wetting layer on at least a portion of a surface of the wetting barrier not covered by the pillar.

3. The IC structure of claim 2, wherein the low wetting layer has a lower solderability than the pillar.

4. The IC structure of claim 2, wherein the low wetting layer is formed from any combination of nickel (Ni), aluminum (Al), and chromium (Cr).

5. The IC structure of claim 2, wherein the low wetting layer is formed in between the wetting barrier and the solder cap.

6. The IC structure of claim 5,
wherein the pillar is a first pillar, and
wherein the IC structure further comprises:
a second pillar on the low wetting layer; and
a contact layer in between the second pillar and the solder cap.

7. The IC structure of claim 6, wherein the contact layer is formed from nickel (Ni).

8. The IC structure of claim 2, further comprising:
a contact layer in between the wetting barrier and the solder cap.

9. The IC structure of claim 8, wherein the contact layer is formed from nickel (Ni).

10. The IC structure of claim 1, wherein the pillar and the wetting barrier are formed from copper (Cu).

11. The IC structure of claim 1, wherein the IC structure is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

12. A method of fabricating an integrated circuit (IC) structure, the method comprising:
forming a pillar on a die, a first surface of the pillar facing the die;
forming a wetting barrier on a second surface of the pillar, a width of the wetting barrier being greater than a width of the pillar; and
forming a solder cap on the wetting barrier such that the die is electrically coupled to the solder cap at least through the pillar and the wetting barrier,
wherein the pillar and the wetting barrier are formed from a same conductive material, and
wherein the width of the wetting barrier is greater than a width of the solder cap.

13. The method of claim 12, wherein forming the pillar and forming the wetting barrier comprise:
depositing a first photoresist on the die;
patterning the first photoresist with a first opening;
forming the pillar in the first opening such that the second surface of the pillar is exposed at a top surface of the first photoresist; and
forming the wetting barrier on the exposed second surface of the pillar with the first photoresist in place.

14. The method of claim 13,
wherein the pillar is formed by plating copper (Cu) in the first opening, or
wherein the wetting barrier is formed by plating Cu on the pillar, or both.

15. The method of claim 13, wherein forming the solder cap comprises:
depositing a second photoresist on the first photoresist to cover the wetting barrier;
patterning the second photoresist with a second opening to expose a portion the wetting barrier, a width of the second opening being less than a width of the first opening;
depositing a solder material on the exposed portion of the wetting barrier within the second opening;
removing the first and second photoresists subsequent to depositing the solder material; and
performing a seed layer etch and a solder reflow subsequent to removing the first and second photoresists.

16. The method of claim 15, wherein forming the solder cap further comprises:
performing a plasma treatment of the wetting barrier subsequent to removing the first and second photoresists and prior to performing the seed layer etch and the solder reflow.

17. The method of claim 13, further comprising:
forming a low wetting layer on at least a portion of a surface of the wetting barrier not covered by the pillar,
wherein the low wetting layer has a lower solderability than the pillar.

18. The method of claim 17, wherein the low wetting layer is formed from any combination of nickel (Ni), aluminum (Al), and chromium (Cr).

19. The method of claim 17,
wherein forming the low wetting layer comprises:
forming the low wetting layer on the wetting barrier with the first photoresist still in place, and
wherein forming the solder cap comprises:
depositing a second photoresist on the first photoresist to cover the low wetting layer;
patterning the second photoresist with a second opening to expose a portion of the surface of the low wetting layer, a width of the second opening being less than a width of the first opening;
depositing a solder material on the exposed portion of the low wetting layer within the second opening;
removing the first and second photoresists subsequent to depositing the solder material; and
performing a seed layer etch and a solder reflow subsequent to removing the first and second photoresists.

20. The method of claim 19, wherein forming the solder cap further comprises:
performing a plasma treatment of the wetting barrier subsequent to removing the first and second photoresists and prior to performing the seed layer etch and the solder reflow.

21. The method of claim 13, further comprising:
forming a contact layer on the wetting barrier such that the contact layer is in between the wetting barrier and the solder cap.

22. The method of claim 21,
wherein forming the contact layer comprises:
depositing a second photoresist on the first photoresist to cover the low wetting layer;
patterning the second photoresist with a second opening to expose a portion of the surface of the low wetting layer, a width of the second opening being less than a width of the first opening;
etching the exposed portion of the low wetting layer to expose a portion of the wetting barrier; and forming the contact layer on the exposed portion of the wetting barrier, and wherein forming the solder cap comprises:
- depositing a solder material on the contact layer within the second opening;
- removing the first and second photoresists subsequent to depositing the solder material; and
- performing a seed layer etch and a solder reflow subsequent to removing the first and second photoresists.

23. The method of claim 22, wherein the contact layer is formed by plating nickel (Ni) on the exposed portion of the wetting barrier.

24. The method of claim 21,
wherein the pillar is a first pillar,
wherein forming the contact layer comprises:
- depositing a second photoresist on the first photoresist to cover the low wetting layer;
- patterning the second photoresist with a second opening to expose a portion of the surface of the low wetting layer, a width of the second opening being less than a width of the first opening;
- form a second pillar on the low wetting layer within the second opening; and
- forming the contact layer on the second pillar, and wherein forming the solder cap comprises:
- depositing a solder material on the contact layer within the second opening;
- removing the first and second photoresists subsequent to depositing the solder material; and
- performing a seed layer etch and a solder reflow subsequent to removing the first and second photoresists.

25. The method of claim 24,
wherein the second pillar is formed by plating copper (Cu) on the low wetting layer, or
wherein the contact layer is formed by plating nickel (Ni) on the second pillar, or both.

26. An integrated circuit (IC) package, comprising:
a substrate comprising a conductive pad; and
an IC structure disposed on the substrate, the IC structure comprising:
- a die;
- a pillar on the die, a first surface of the pillar facing the die;
- a wetting barrier on a second surface of the pillar, a width of the wetting barrier being greater than a width of the pillar; and
- a solder cap on the wetting barrier such that the die is electrically coupled to the conductive pad of the substrate at least through the solder cap, the pillar, and the wetting barrier, wherein the pillar and the wetting barrier are formed from a same conductive material, and
wherein the width of the wetting barrier is greater than a width of the solder cap.

27. The IC package of claim 26, wherein the IC structure further comprises:
a low wetting layer on at least a portion of a surface of the wetting barrier not covered by the pillar, the low wetting layer having a lower solderability than then the pillar.

28. The IC package of claim 26,
wherein the pillar is a first pillar, and
wherein the IC structure further comprises:
- a second pillar on the low wetting layer; and
- a contact layer in between the second pillar and the solder cap.

29. The IC package of claim 26, wherein the IC structure further comprises:
a contact layer in between the wetting barrier and the solder cap.

30. The IC package of claim 26, wherein the pillar and the wetting barrier are formed from copper (Cu).

* * * * *